United States Patent
Imai et al.

(10) Patent No.: US 6,337,826 B1
(45) Date of Patent: Jan. 8, 2002

(54) CLOCK SYNCHRONIZATION SEMICONDUCTOR MEMORY DEVICE SEQUENTIALLY OUTPUTTING DATA BIT BY BIT

(75) Inventors: Seiro Imai, Yokohama; Kaoru Nakagawa, Kawasaki, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/527,306

(22) Filed: Mar. 16, 2000

(30) Foreign Application Priority Data

Mar. 17, 1999 (JP) ............................. 11-071606
Nov. 26, 1999 (JP) ............................. 11-335441

(51) Int. Cl.⁷ ................................. G11C 7/00
(52) U.S. Cl. .................. 365/221; 365/219; 365/230.03; 365/239
(58) Field of Search ................. 365/221, 219, 365/239, 240, 230.03, 189.05, 233

(56) References Cited

U.S. PATENT DOCUMENTS

| | | | |
|---|---|---|---|
| 5,142,637 A | * 8/1992 | Harlin et al. | 711/106 |
| 5,148,523 A | * 9/1992 | Harlin et al. | 345/519 |
| 5,148,524 A | * 9/1992 | Harlin et al. | 345/519 |
| 5,198,999 A | 3/1993 | Abe et al. | |
| 5,526,316 A | * 6/1996 | Lin | 365/221 |
| RE35,680 E | * 12/1997 | Harlin et al. | 345/517 |

* cited by examiner

*Primary Examiner*—Son L. Mai
*Assistant Examiner*—Gene N. Auduong
(74) *Attorney, Agent, or Firm*—Banner & Witcoff, LTD.

(57) ABSTRACT

A semiconductor integrated circuit is provided with a plurality of selectors, each of which is connected to a corresponding one of a plurality of data lines through which bit data read out from a corresponding one of a plurality of cell array blocks is transmitted, wherein a selector control circuit controls selection operations of the selectors based on a control clock so that the selectors select and output readout data in the order in which the bit data are read out from the corresponding cell array blocks.

10 Claims, 18 Drawing Sheets

FIG. 2    (PRIOR ART)

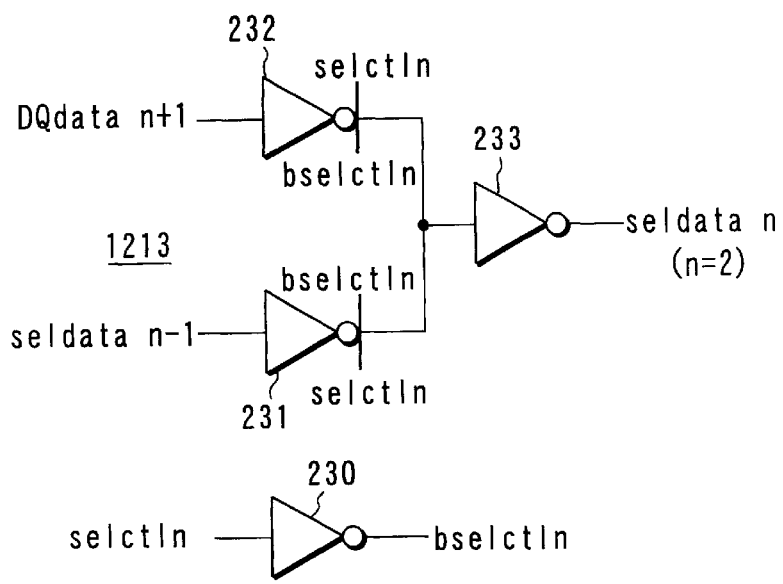
FIG. 5A
FIG. 5B
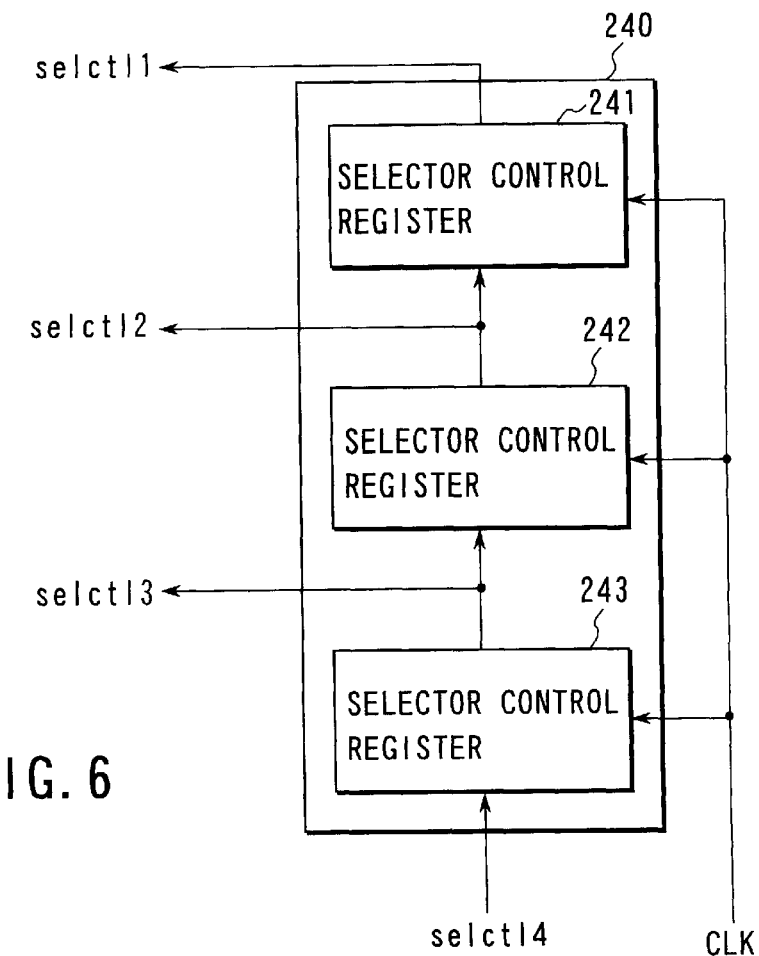
FIG. 6

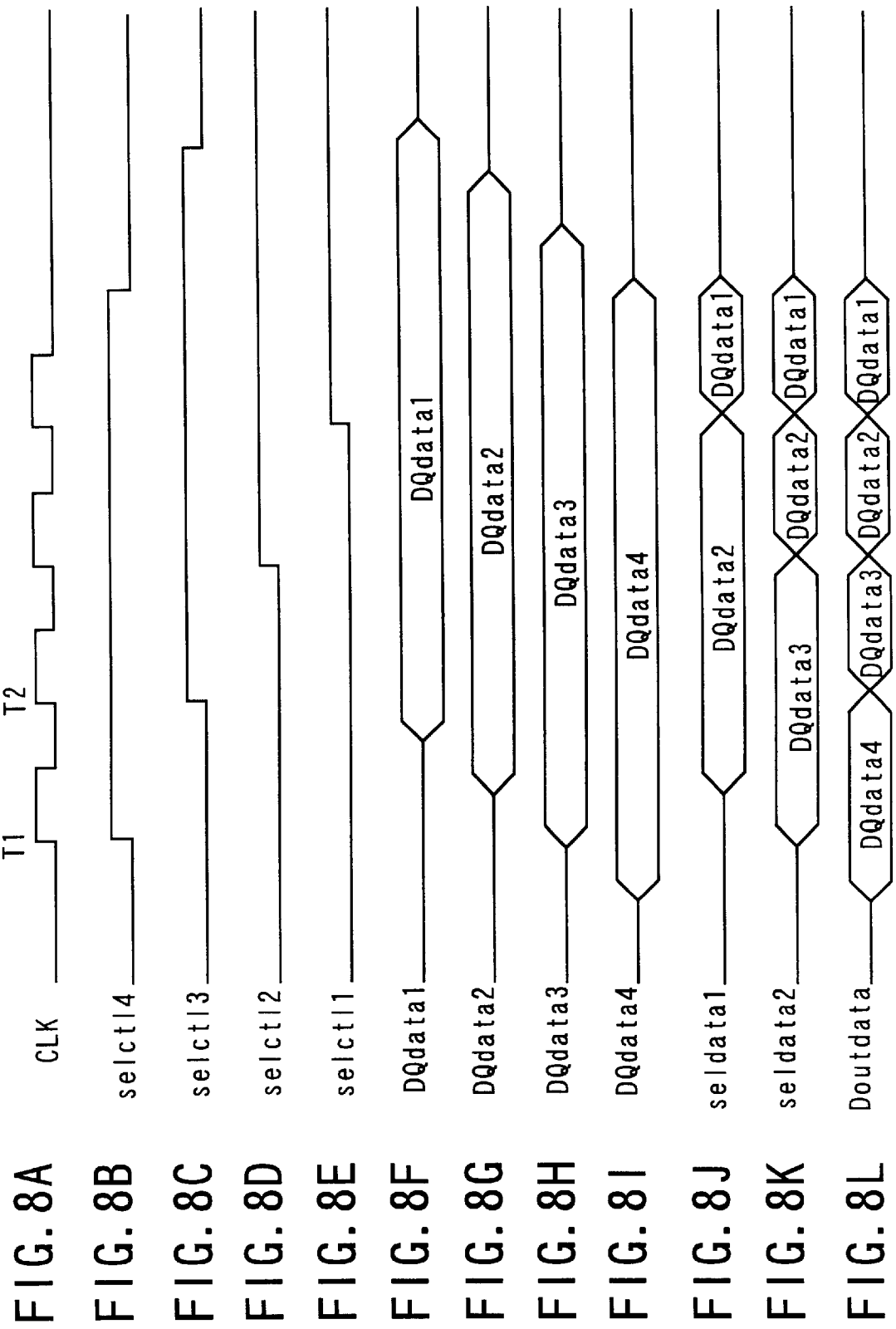

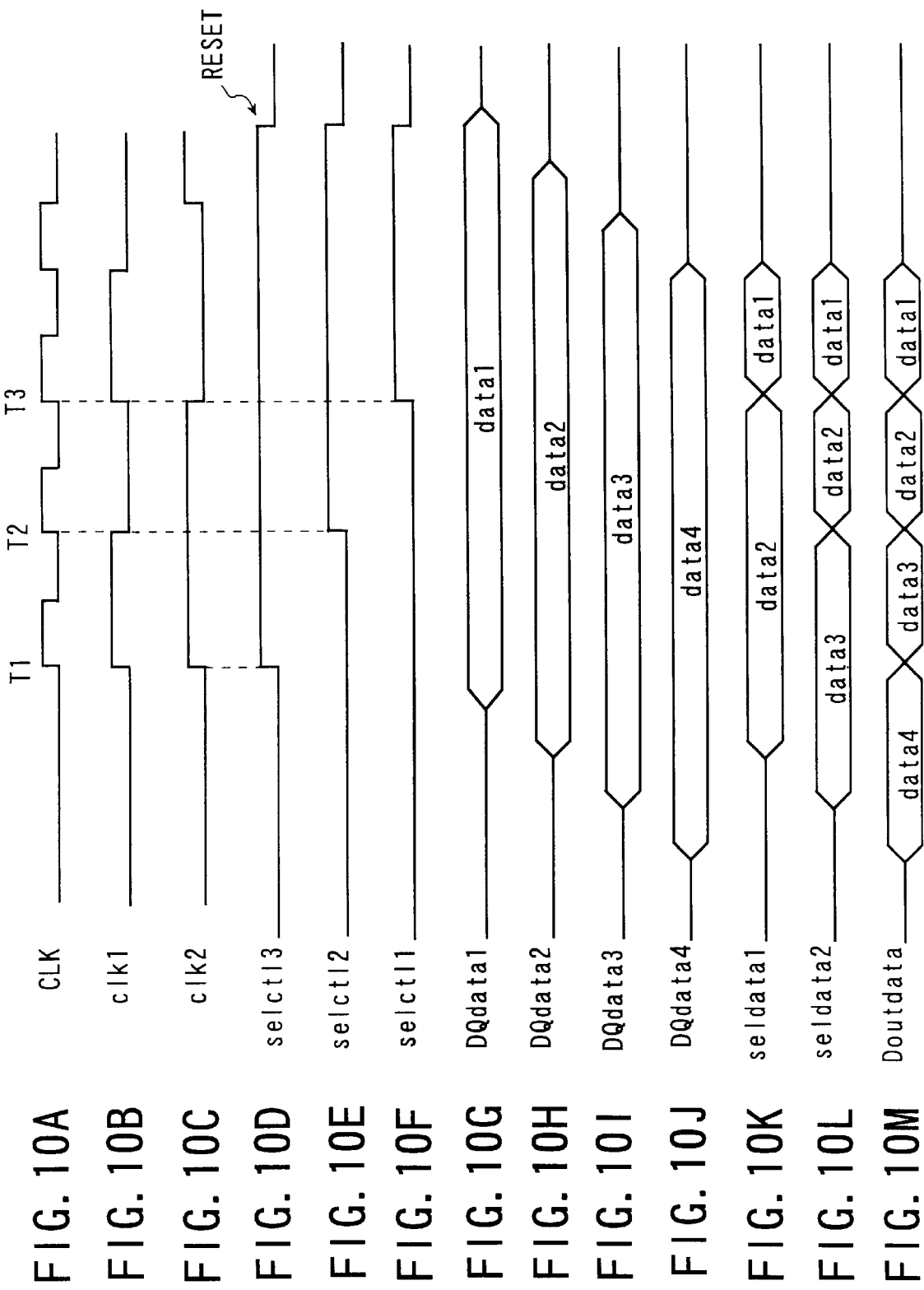

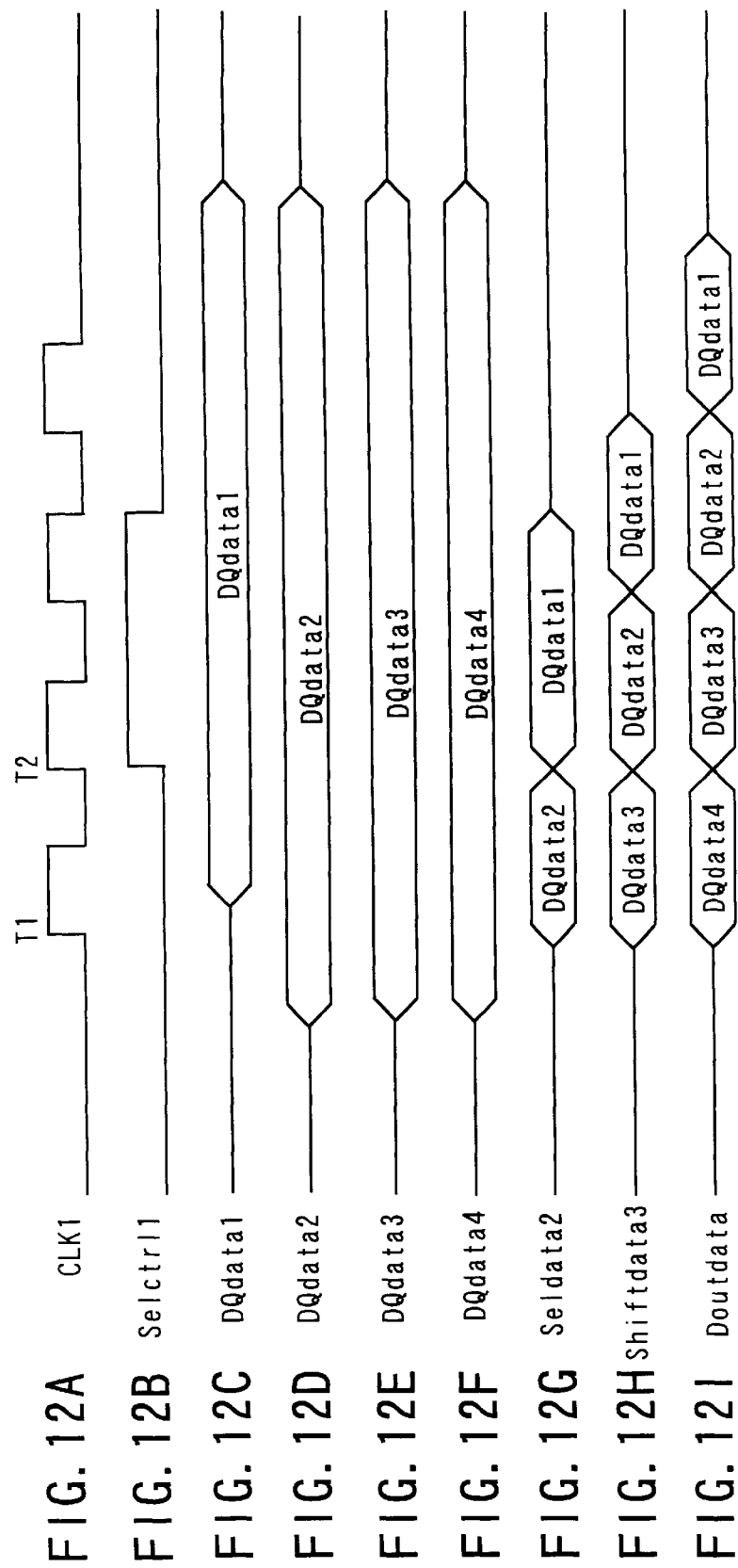

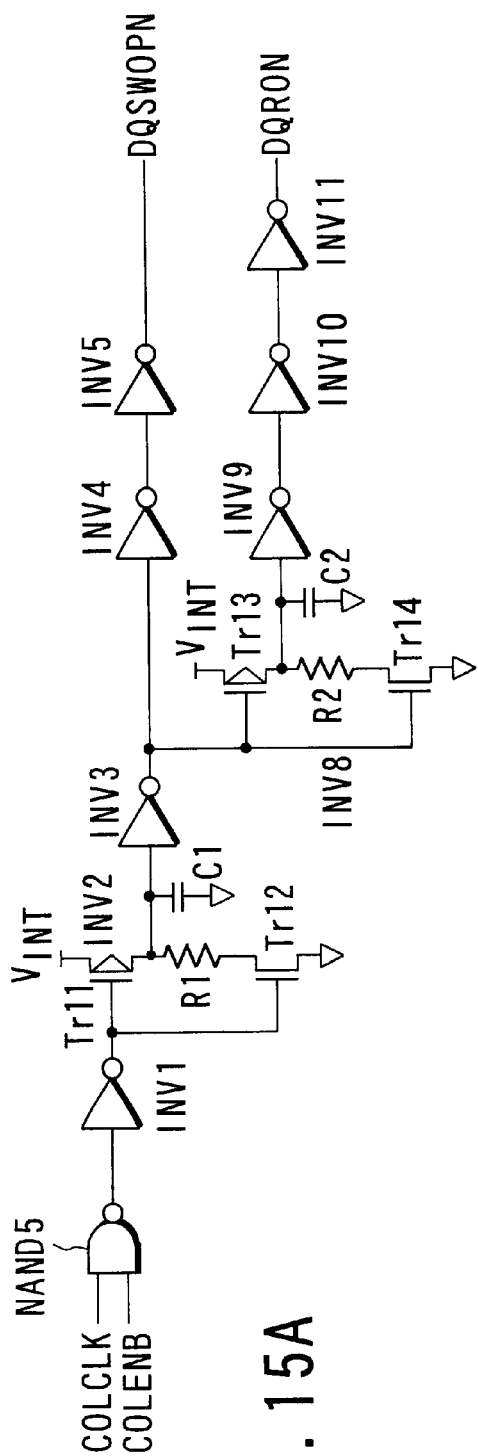
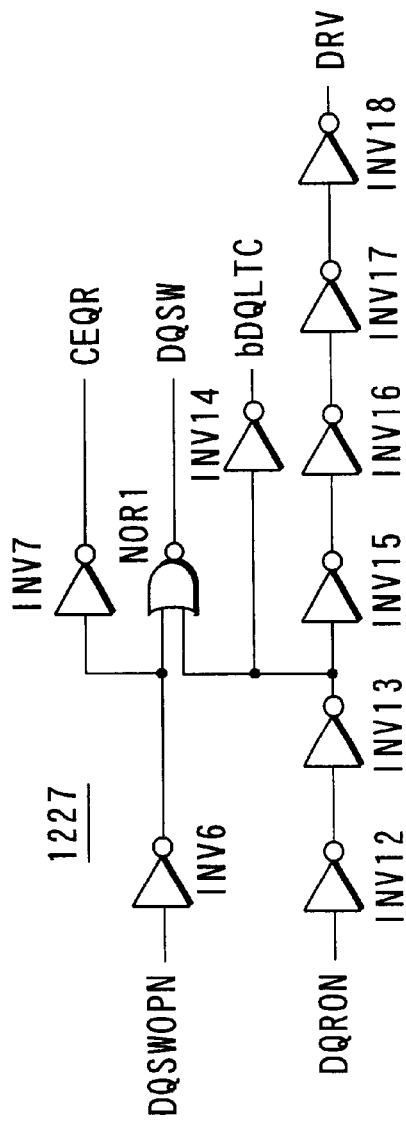
FIG. 15A
FIG. 15B

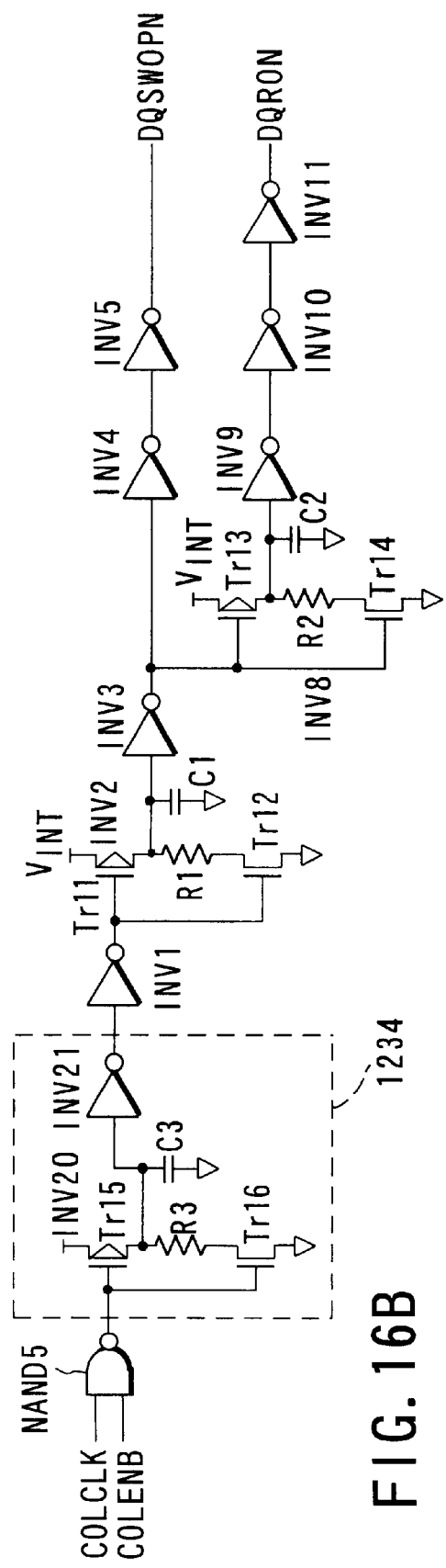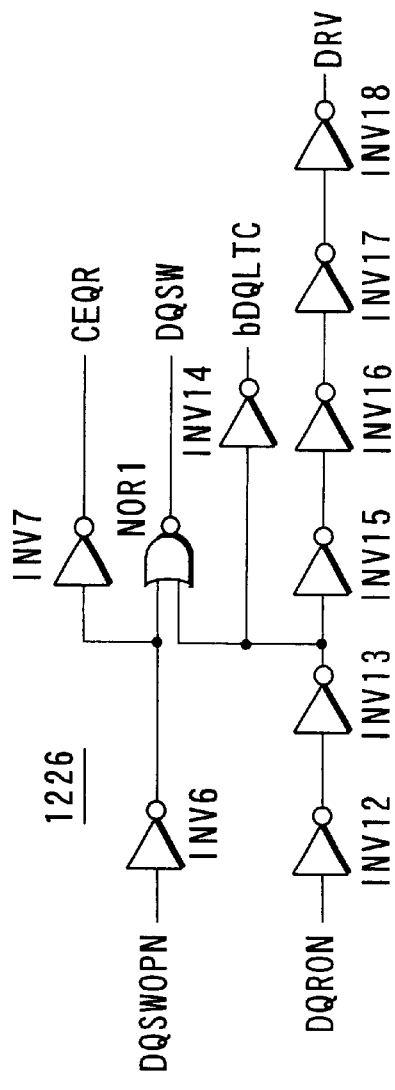
FIG. 16B
FIG. 16A

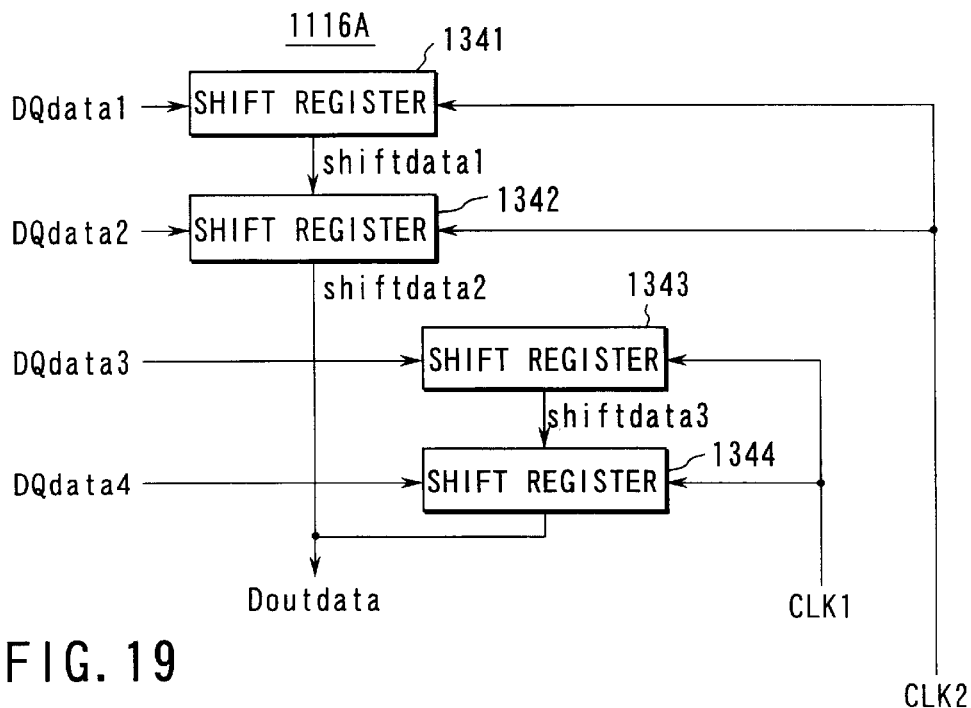
FIG. 19
FIG. 20A CLK1
FIG. 20B CLK2
FIG. 20C DQdata1 — data1
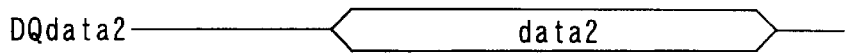
FIG. 20D DQdata2 — data2
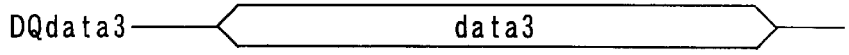
FIG. 20E DQdata3 — data3
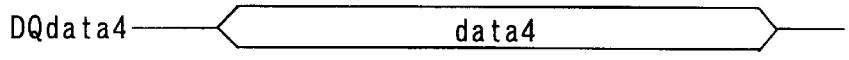
FIG. 20F DQdata4 — data4
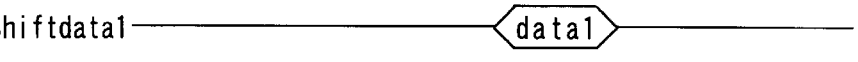
FIG. 20G Shiftdata1 — data1
FIG. 20H Shiftdata2 — data3
FIG. 20I Doutdata — data4, data3, data2, data1

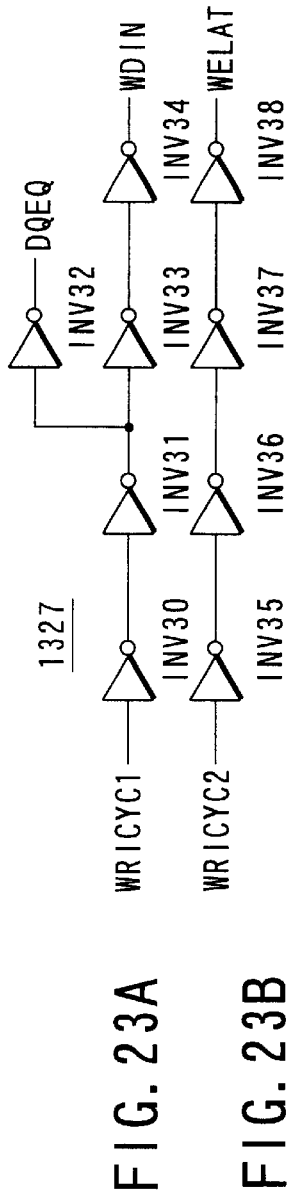
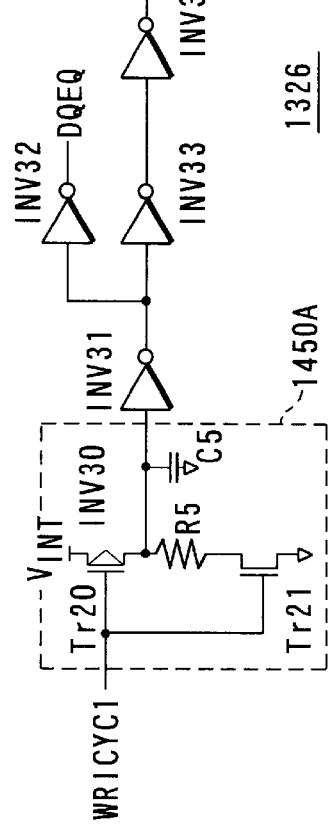
FIG. 23A
FIG. 23B
FIG. 24A
FIG. 24B

CLOCK SYNCHRONIZATION SEMICONDUCTOR MEMORY DEVICE SEQUENTIALLY OUTPUTTING DATA BIT BY BIT

CROSS-REFERENCE TO RELATED APPLICATIONS

This application is based upon and claims the benefit of priority from the prior Japanese Patent Applications No. 11-71606, filed Mar. 17, 1999; and No. 11-335441, filed Nov. 26, 1999, the entire contents of which are incorporated herein by reference.

BACKGROUND OF THE INVENTION

The present invention relates to a semiconductor integrated circuit, and in particular, to a clock synchronization semiconductor integrated circuit for use, for example, in a semiconductor memory such as a clock synchronization DRAM or ROM which has an operation mode for allowing the circuit to internally and continuously serially transfer multi-bit data.

In recent years, the wiring length of semiconductor memories has been increased linearly with the chip size. In addition, the use of finer elements has been contributing to reduction in wiring width and interval. As a result, the wiring resistance and capacity have increased, and the adverse effect of a possible wiring delay on the overall operation speed performance is growing.

Due to its wiring length over which signals are transmitted, a portion of a chip located far away from I/O pads and a control circuit (for example, a peripheral portion of the chip) is more significantly affected by a possible wiring delay than a portion thereof located closer to the input pads and control circuit (for example, a central portion of the chip). As a result, reading data from cell array blocks in the chip peripheral portion requires a larger amount of time than reading data from cell array blocks in the chip central portion.

Some clock synchronization DRAMs have an operation mode or an output data transfer system for loading, in a transfer block, data read out from a plurality of cell array blocks arranged on a chip so that the output data of multiple bits loaded in this transfer block are continuously transferred bit by bit to an output buffer in synchronism with a clock synchronization signal.

The time required to access the plurality of cell array blocks depends on the wiring length of an address signal line between an address buffer and an address decoder for each of the cell array blocks. With conventional on-chip arrangements, accesses to the cell array blocks in the chip peripheral portion require a larger amount of time than accesses to the cell array blocks in the chip central portion.

In the conventional clock synchronization DRAM, however, data read out from the cell array blocks in the chip peripheral portion are loaded in the transfer block simultaneously with data read out from the cell array blocks in the chip central portion.

This is disadvantageous in that only a small timing margin is available in loading, in the transfer block, data read out from the cell array blocks in the chip peripheral portion, which may be caused by an access delay, whereby data transfers from the cell array blocks in the chip peripheral portion may determine the timings for all the cell array blocks. In particular, when data being read out from a cell array block in the chip peripheral portion, which may be subjected to an access delay, the data is to be loaded in the transfer block and if this data has not reached the transfer block yet at the loading timing, then loading of this data may fail.

The above conventional problem will be described below in detail with reference to FIGS. 1, 2, and 3A–3I.

FIG. 1 shows an example of a configuration of part of a conventional clock synchronization DRAM, particularly, of its memory cell arrays and other parts related to output data transfers.

In FIG. 1, the memory cell arrays are divided into a plurality of (in this example, four) cell array blocks (each including a sense amplifier) 101 to 104, and include a row decoder 11 shared by each of the cell array blocks 101 to 104 and column decoders 121 to 124 corresponding to the cell array blocks 101 to 104, respectively.

An address signal is input to an address buffer 13, a row address signal is supplied to the row decoder 11, and a column address signal is supplied to each of the column decoder 121 to 124.

Data read out from a memory cell in each cell array block 101 to 104 and corresponding to the row and column address signals is stored in a corresponding one of four data line buffers (DQ Buffers) 141 to 144.

Data DQdata1 to DQdata4 stored in the data line buffers 141 to 144, respectively, are input to a data transfer block 16 through data lines 151 to 154, respectively, and from the data transfer block 16, the data are output in a predetermined order in synchronism with a control clock CLK. The data are further output to an output buffer (Dout Buffer) 18 through an output signal line 17.

In the arrangement of the cell array blocks 101 to 104, the cell array block 101 is located closer to a chip peripheral portion than the cell array block 104, and due to the locational relationship between the address buffer 13 and the cell array blocks 101 to 104, the wiring for each column address signal is relatively long and the lengths of the wirings for column address signals between the address buffer 13 and each of the column decoders 121 to 124 vary.

FIG. 2 shows a conventional example of the data transfer block 16 in FIG. 1.

The four bit data DQdata1 to DQdata4 read out in parallel from the four cell array blocks and stored in the corresponding data line buffers are stored in first to final registers 71 to 74, respectively, of a shift register in response to the control clock CLK. The data data1 to data4 stored in the first to final registers 71 to 74 are transferred in synchronism with a falling edge of the control clock CLK, and output data Dout data from the final register 74 is output to the output buffer 18 in FIG. 1.

FIGS. 3A to 3I are timing charts showing an example of an operation of the shift register in FIG. 2.

At a rising edge of the control clock CLK, the data data1 in the first stage register 71 is transferred to the second stage register 72 as shift data shiftdata1, the data data2 in the second register 72 is transferred to the third register 73 as shift data shiftdata2, and the data data3 in the third stage register 73 is transferred to the final stage register 74 as shift data shiftdata3. The shift data data4 in the final stage register 74 changes to the output data Dout data. Likewise, at each rising edge of the sequentially supplied control clock CLK, data is shifted and then transferred. Then, the bit data data4, data3, data2, data1 are sequentially output as the output data Dout data.

In this manner, of the data DQdata1 to DQdata4 input to the data transfer block, the data DQdata1, which is output from the cell array block 101 in the chip peripheral portion, takes effect as the output data Dout data last.

On the other hand, the data DQdata1 to DQdata4 input to the data transfer block are each loaded at the same rising edge of the control clock CLK, that is, these data each use the same loading timing.

Thus, the data DQdata1, which is output from the cell array block 101 in the chip peripheral portion, has the smallest loading timing margin.

In FIG. 1, operational timings for the transfer block 16 will be considered by assuming that a significant signal delay occur in word lines in the cell array blocks 101 to 104, which are selectively driven by the row decoder 11, and that the amount of time required for the data DQdata1 output from the cell array block 101 in the chip peripheral portion to reach the data line buffer 131 substantially differs from the amount of time required for the data DQdata4 output from the cell array block 104 in the chip central portion to reach the data line buffer 144.

In this case, a data loading period T following a certain rising edge of the control clock CLK is considered. As shown in FIGS. 3A to 3E, of the data DQdata1 to DQdata4 input to the data transfer block 16, the DQdata2 to DQdata4 are loaded in the registers 72, 73, 74, respectively, as shown in FIGS. 3G to 3I. The data DQdata1, which has been output from the cell array block 101 in the furthest chip peripheral portion, has not reached the register 71 yet, as shown in FIG. 3B. Consequently, this data DQdata1 cannot be loaded in the register 71, thereby preventing the correct output from being provided for the data transfer block 16 as the output data Dout data.

As described above, a possible signal delay forces the data transfer block, which is shown in FIG. 2, to use a small timing margin in loading the data output from the cell array block 101 in the chip peripheral portion. As a result, a long signal delay in the word lines may preclude the output of the data from the cell array block 101 in the chip peripheral portion.

The above conventional examples in FIGS. 1 and 2 have been described in conjunction with the disadvantage arising from the difference in access time between memory cell arrays located close to the address buffer 13 and memory cell arrays located far away therefrom. However, an output data path leading from each of the memory cell arrays to the output buffer may also be a disadvantage. That is, the data may not be output correctly due to the difference in distance between each of the memory cell arrays and the output buffer. This may occur when long output signal lines must be wired, and may cause a significant signal delay, which in turn induces, for example, delayed data outputs or obtuse output waveforms.

In addition to the above read-out delay problem, a major recent problem of semiconductor integrated circuits, particularly semiconductor memories is noise in a power line originating in a temporary increase in power consumption. In particular, in a clock synchronization semiconductor memory operating clock synchronization with an external clock, a large number of circuits may operate simultaneously with the same timing, causing a high current to temporarily flow through the power line.

The chip includes, for example, a plurality of data line buffer circuits providing an I/O data transfer function; however, since the same signal is used to activate these buffer circuits, the plurality of data line buffer circuits simultaneously consume power, resulting in the flow of a high peak current.

Accommodating this high peak current requires an internal power supply with a high driving capability and a wide power line. Thus, the number of circuits and the area of the chip must be increased.

BRIEF SUMMARY OF THE INVENTION

The present invention is provided to solve the above problems, and it is an object thereof is to provide a semiconductor integrated circuit that increases a timing margin for loading of output data from those of a plurality of circuit blocks outputting data in parallel that are subject to a long delay in control signal transfer, in order to prevent the transfer of data output from these circuit blocks from determining timings for all data output from each circuit block, thereby enabling data output from each circuit block to be reliably obtained.

In addition, the present invention is provided in view of the above circumstances, and it is an object thereof to reduce a peak current occurring during an I/O data transfer in order to reduce the area of a chip in the semiconductor integrated circuit.

A first aspect of the present invention provides a semiconductor integrated circuit comprising a first to an n-th data lines through which data read from n (n is a positive integer) cell array blocks are transmitted, a data selector having a plurality of selectors to which at least two of the data on the first to n-th data lines are input, for selecting and outputting the n data read out to the first to n-th data lines from the n cell array blocks, in the order in which the data were read out from the n cell array blocks, an output buffer to which an output from the data selector is transmitted via an output signal line, and a selector control circuit for controlling and switching the selection operation of the data selector based on a control clock.

A semiconductor integrated circuit according to a second aspect of the present invention is the first semiconductor integrated circuit wherein the data selector selects one of the n data read out to the first to n-th data lines from the n cell array blocks that was read out first from the corresponding cell array block and then sequentially selects and outputs the remaining data in synchronism with a first to an n-th selection signals in the order in which these data were read out from the corresponding cell array blocks.

A semiconductor integrated circuit according to a third aspect of the present invention is the second semiconductor integrated circuit wherein the data selector comprises an i-th selector controlled to select one of the data input through the first and second lines that was read out earlier from the corresponding cell array block and then to select the other data based on a first selection signal, and (n−2) (i+1) selectors controlled to select one of the output data from the i-th (i=1 to n−2) selector and data input through an (i+2) data line that was read out earlier from the corresponding cell array block and then to correspondingly select the other data based on a second to an (n−1)-th selection signals.

A semiconductor integrated circuit according to a fourth aspect of the present invention is the second or third semiconductor integrated circuit wherein the first selection signal and the second to (n−1)-th selection signals have their logic level reversed in synchronism with control clock signals in the order from the (n+1) to first selection signals, and wherein the data selector selects and outputs the data in the order from the data on the n-th data line to the data on the first data line.

Further aspect of a semiconductor integrated circuit according to the present invention comprises a first and a second data lines for transmitting data, a first and a second data line buffer circuits connected to the first and second data lines, respectively, and a first and a second data line buffer control circuits for activating the first and second data line buffer circuits, respectively, wherein the first data line buffer control circuit has a delay time different from a delay time in the second data line buffer control circuit.

In addition, the semiconductor integrated circuit desirably includes the following features:

The semiconductor integrated circuit is characterized by further comprising first and second data selectors to which data is transmitted from the first and second data line buffer circuits, respectively, and in that the first data selector performs the selection operation with timings different from those for the second data selector.

The semiconductor integrated circuit is characterized in that the first data line buffer circuit is activated later than the second data line buffer circuit, and in that the first data selector performs the selection operation later than the second data selector.

The semiconductor integrated circuit is characterized in that the first and second data selectors each comprise shift registers, and in that the first data selector performs the selection operation in response to a clock signal issued later than that for the second data selector.

The semiconductor integrated circuit is characterized in that the first data line buffer control circuit has the same configuration as the second data line buffer control circuit but further includes a delay element.

The semiconductor integrated circuit is characterized in that the first data line buffer circuit is activated later than the second line buffer circuit.

With the above configuration, the present invention reduces a peak current during an I/O data transfer and also reduces the area of a chip in the semiconductor integrated circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5A is a logic circuit diagram showing an example of a configuration of a selector in FIG. 4.

FIG. 5B shows an example of a circuit for generating a control signal for use in the circuit in FIG. 5A.

FIG. 6 is a logic circuit diagram showing an example of a configuration of a selector control circuit in FIG. 4.

FIGS. 8A to 8L are timing charts showing an example of an operation of a data transfer block in FIG. 4.

FIGS. 10A to 10M are timing charts showing an example of an operation of the data transfer block performed if the selector control circuit in FIG. 9 is used.

FIGS. 12A to 12I show flow charts showing an operation of the circuit in FIG. 11.

FIGS. 15A and 15B are block diagrams each showing an example of a configuration of a data line buffer control signal generation circuit in FIG. 13.

FIGS. 16A and 16B are block diagrams each showing an example of a configuration of one of the output data line buffer control signal generation circuits in FIG. 13.

FIG. 19 is a block diagram showing another example of a configuration of the data transfer block in FIG. 13.

FIGS. 20A to 20I are timing charts showing an operation of the data transfer block in FIG. 19.

FIGS. 23A and 23B are block diagrams each showing an example of a configuration of one of the data line buffer control signal generation circuits shown in FIG. 21.

FIGS. 24A and 24B are block diagrams each showing an example of a configuration of the other output data line buffer control signal generation circuit in FIG. 21.

DETAILED DESCRIPTION OF THE INVENTION

Each embodiment of the present invention will be described below in detail with reference to the drawings.

Figure 1:
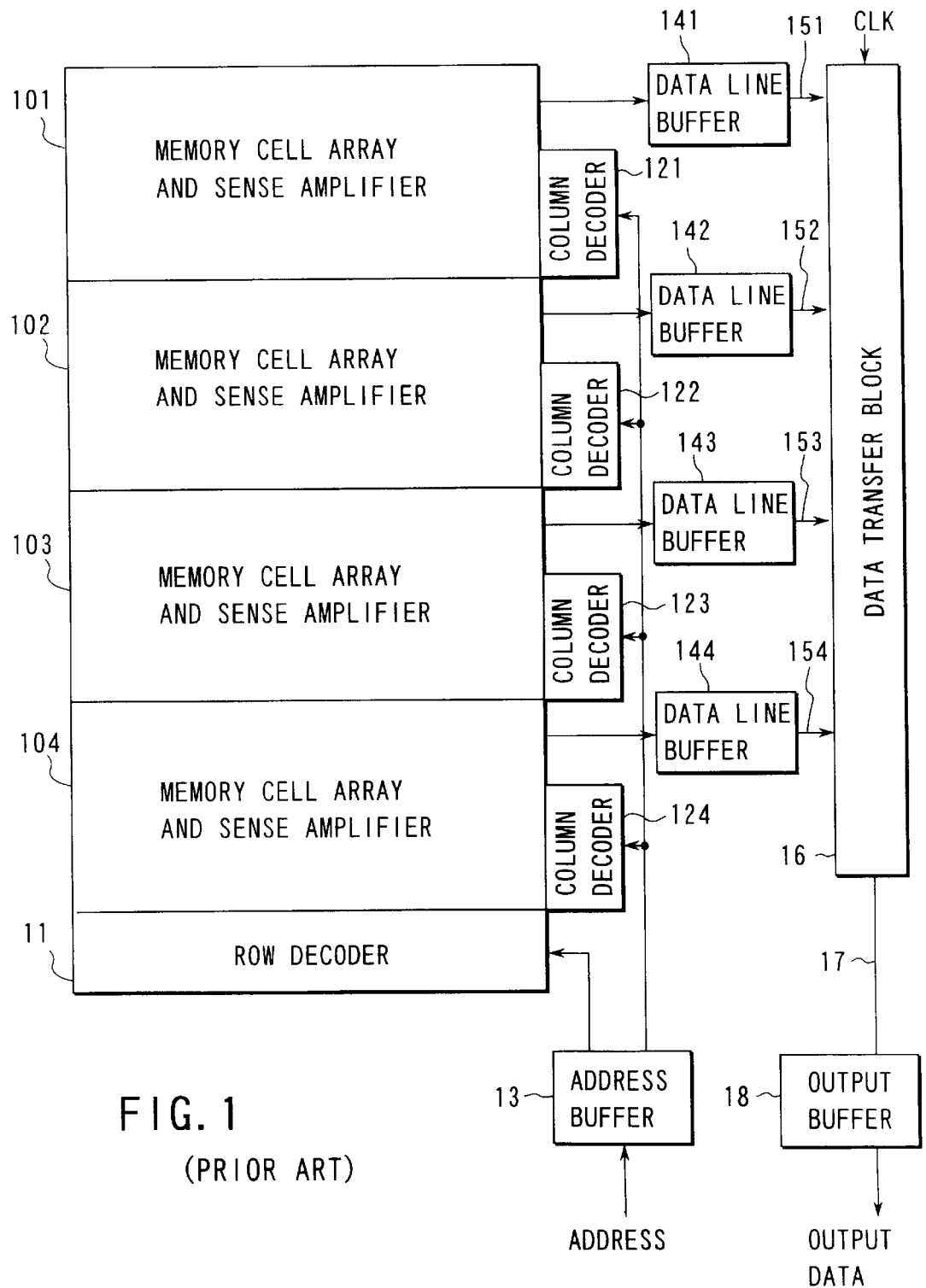
FIG. 1 is a block diagram showing a conventional general configuration of parts related to output data transfers from a clock synchronization DRAM.
Figure 2:
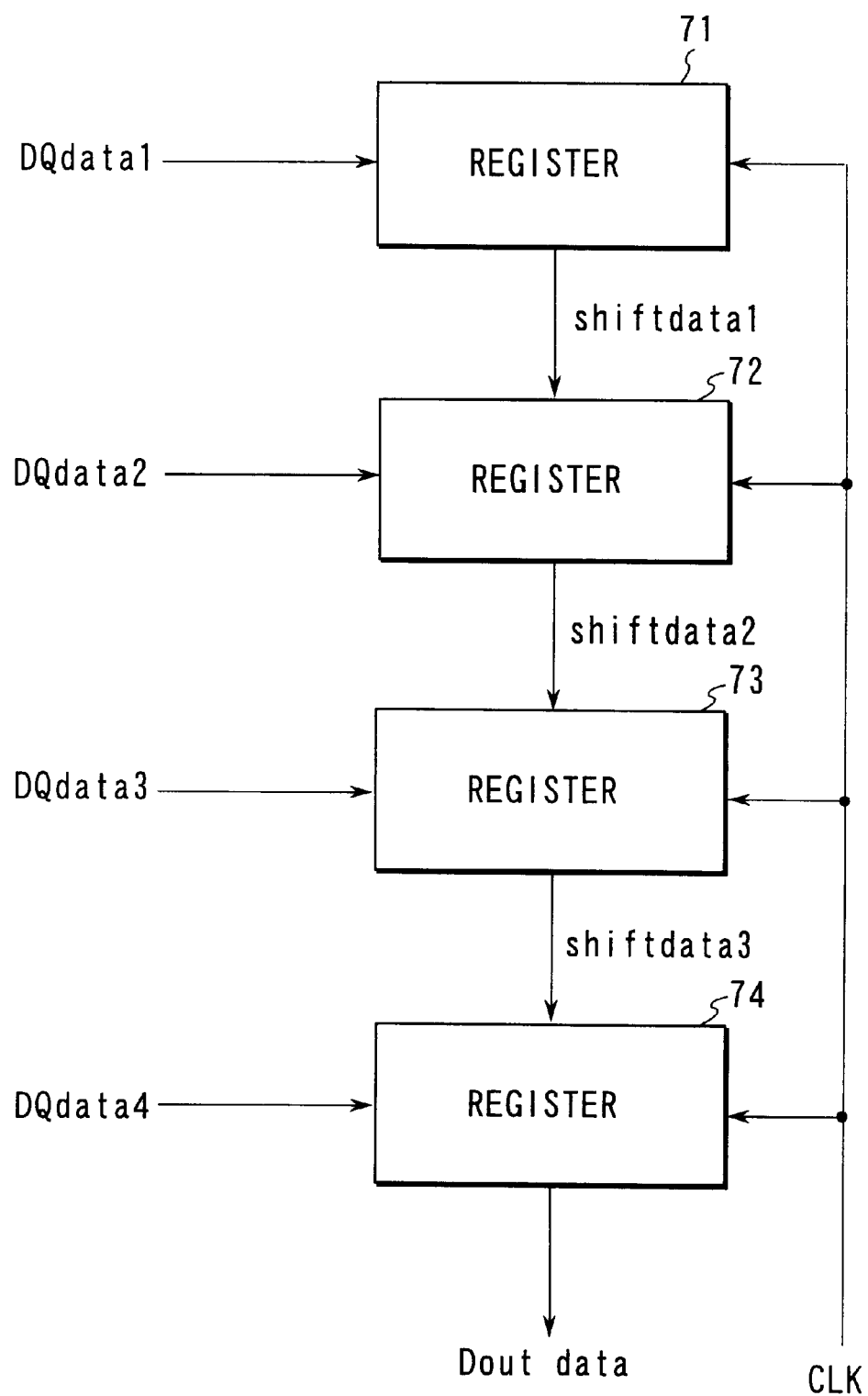
FIG. 2 is a block diagram showing a conventional example of an internal configuration of a data transfer block in FIG. 1.
Figure 3:
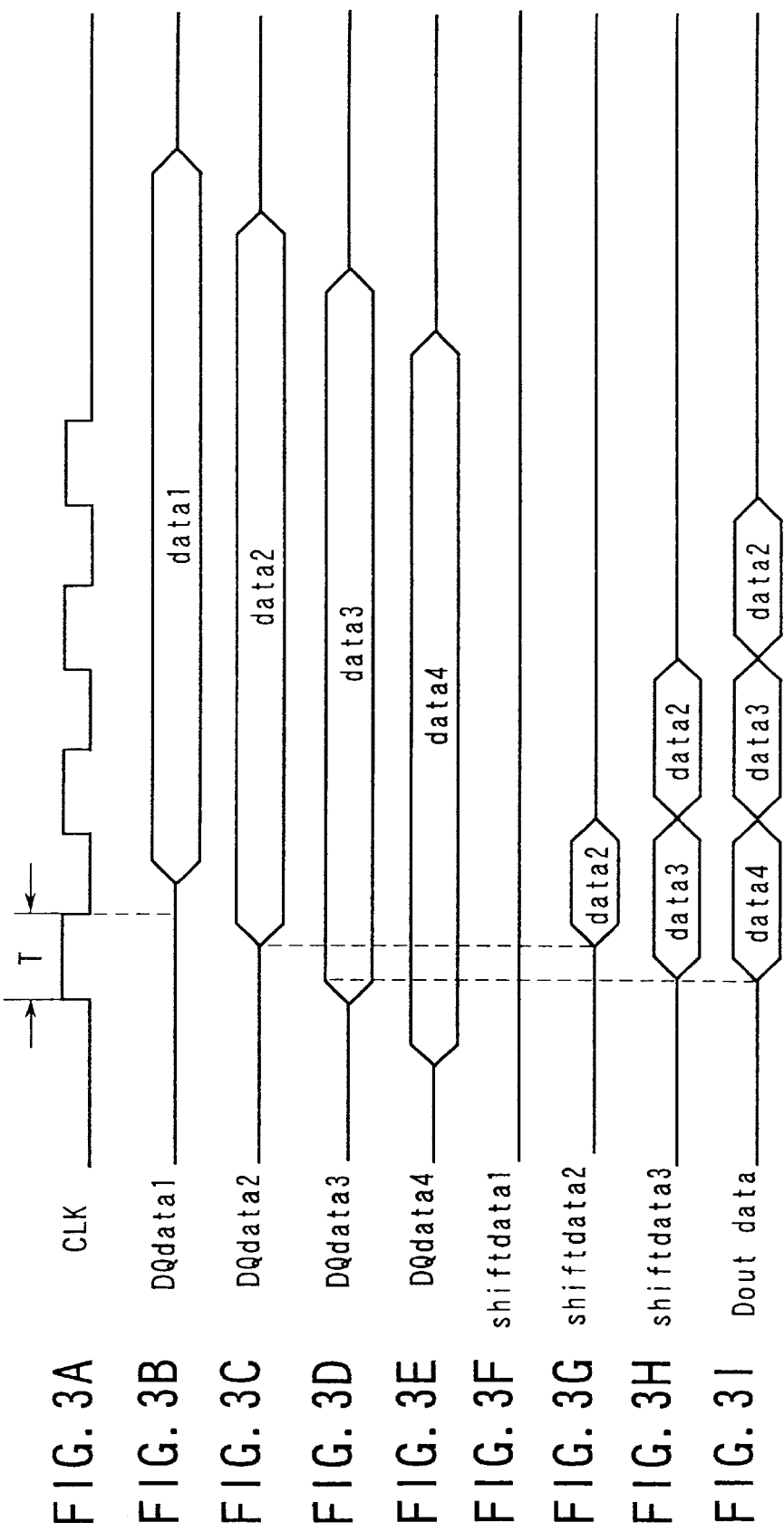
FIGS. 3A to 3I are timing charts showing an example of an abnormal operation performed during the conventional output data transfer shown in FIGS. 1 and 2.
Figure 4:
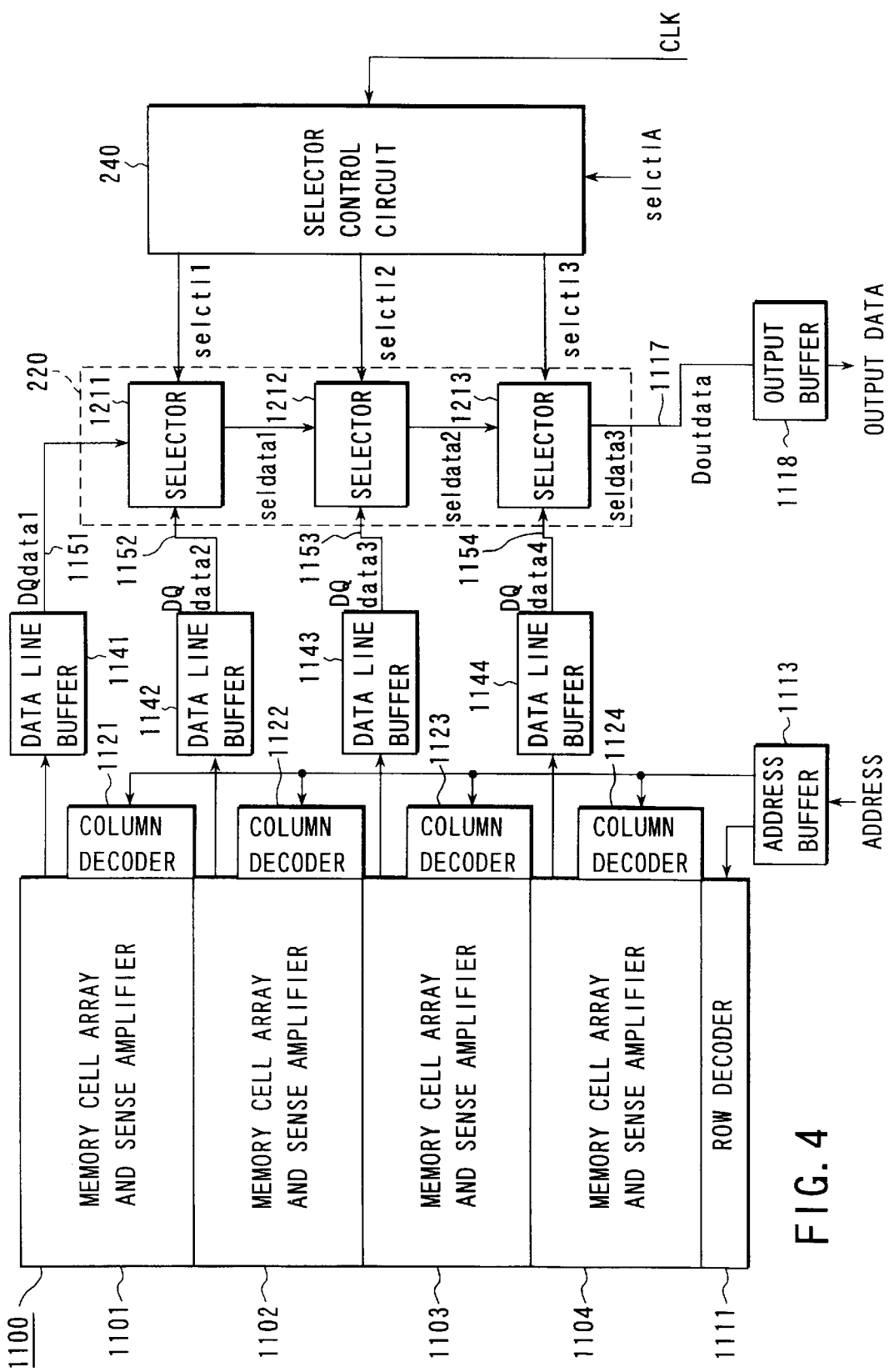
FIG. 4 is a block diagram showing essential parts of a clock synchronization DRAM according to a first embodiment of the present invention.

FIG. 4 shows an example of a configuration of part of a clock synchronization DRAM, particularly, of its memory cell arrays and other parts related to output data transfers. This clock synchronization DRAM has its operation controlled by a clock synchronization clock signal CLK so as to continuously output data bit by bit. In this example, the clock synchronization DRAM comprises cell array blocks 1101 to 1104, data line buffers 1141 to 1144, data lines 1151 to 1154, a data selector circuit 220, and a selector control circuit 240.

In FIG. 4, the memory cell arrays are divided into the four cell array blocks (each including a sense amplifier) and include a row decoder 1111 shared by each of the cell array blocks 1101 to 1104 and column decoders 1121 to 1124 corresponding to the cell array blocks 1101 to 1104, respectively.

An address signal is input to an address buffer 1113, a row address signal is supplied to the row decoder 1111, and a column address signal is supplied to each of the column decoder 1121 to 1124.

Data read from a memory cell in each cell array block 1101 to 1104 corresponding to the row and column address signals is stored in a corresponding one of four data line buffers (DQ Buffers) 1141 to 1144.

Data DQdata1 to DQdata4 stored in the data line buffers 1141 to 1144, respectively, are input to a data selector circuit 220 through a first to a fourth data lines 1151 to 1154, respectively. The data DQdata1 to DQdata4 are sequentially transferred through the data selector circuit 220 by selectors 1211 to 1213 controlled by selector signals selctl1 to selctl3 formed in a selector control circuit 240 in a predetermined order in synchronism with the control clock CLK, and is output to an output buffer (Dout Buffer) 1118 via an output signal line 1117 as output data Doutdata.

In the arrangement of the cell array blocks 1101 to 1104, the cell array block 1101 is located closer to a chip peripheral portion than the cell array block 1104, and due to the locational relationship between the address buffer 1113 and the cell array blocks 1101 to 1104, the wiring distance for each column address signal is relatively long and besides the wiring distance for column address signals from the column decoder 1121 to the column decoder 1124 relative to the address buffer 1113 is long. Thus, the data DQdata4 from the data line buffer 1144 is output first, whereas the data DQdata1 is output last.

In FIG. 4, under the control of the selector control circuit 210 sequentially selects and outputs, in the order of arrival, the data DQdata1 to DQdata4 input from the four data lines 1151 to 1154 in parallel, and are transferred to the output buffer 1118 via the output signal line 1117.

The data selector 220 consists of three 2-input selectors 1211 to 1213 connected to the four data lines 1151 to 1154. Of the four data DQdata1 to DQdata4 read out from the four cell array blocks 1101 to 1104 to the four data lines 1151 to 1154, the data read out first from the corresponding cell array block, in this case, the data DQdata4 is selected, and the remaining data are sequentially selected and output in synchronism with the third to first selection signals selctl3 to selctl1 in the order in which the data is read out from the corresponding cell array block. In this case, the data are output in the order of the DQdata4, the DQdata3, the DQdata2, and the DQdata1.

FIG. 5A is a logic circuit diagram showing as a typical example, one 1213 of the selectors in the data selector 220, which is shown in FIG. 4. FIG. 5B shows a circuit for generating complementary control signals comprising a given selection signal selctln and a signal bselctln obtained by reversing the selection signal selctln using an inverter 230.

If, for example, n=3, complementary signals consisting of a selection signal selctl3 and a signal bselctl3 obtained by reversing the selection signal selctl3 is supplied to the selector 1213. FIG. 5A shows a first clocked inverter 231 controlled by the complementary signals bselctln (bselctl3), selctln (selctl3) and to which output data seldatan–1 (seldata2) from the preceding selector 1212 is input, a second clocked inverter 232 controlled complementarily with the first clocked inverter 231 by the complementary signals selctln (selctl3), bselctln (bselctl3) and to which data PQdatan+1(DQdata4) is input, and an inverter 233 for outputting data seldatan (seldata3) by reversing wired OR outputs from these clocked inverters 231, 232.

The other selectors 1211, 1212 are configured similarly to the selector 1213.

Next, the configuration and operation of the selector control circuit 240 in FIG. 4 for generating the selection signals selctl1 to selctl3 will be described with reference to FIGS. 6, 7A, and 7B.

The selector control circuit 240 consists of three selector control registers 243 to 241 cascaded in three tiers and controlled by the control clock signal CLK.

The selector control register 243 in the first tier receives a first selection signal selctl4 generated by a signal generation circuit (not shown) in synchronism with the clock signal CLK, and an output signal from the selector control register 243 in the first tier is supplied to the next selector control register 242 while being output as the third selection signal selctl3.

Synchronizing with the next clock signal CLK, the selector control register 242 in the second tier generates the second selection signal selctl2 in response to the output signal selctl3 from the preceding register, and supplies this signal to the selector control register 241 in the third tier while outputting it as the selection signal selctl2.

Synchronizing with the third clock signal CLK, the selector control register 241 in the third tier forms and outputs the first selection signal selctl1.

Figure 7A:
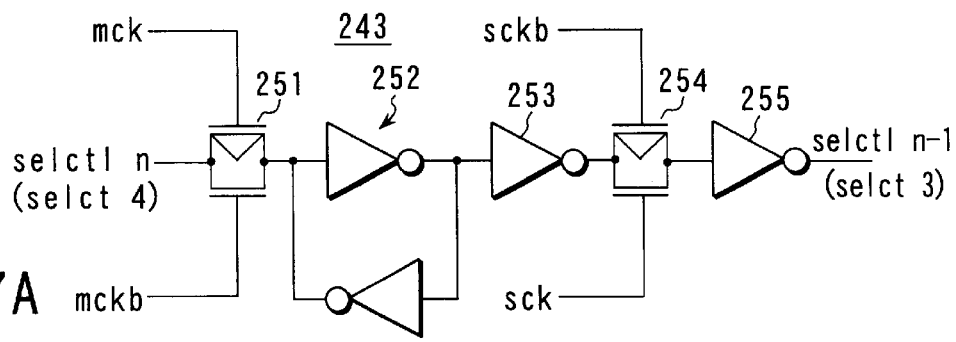
FIG. 7A is a logic circuit diagram showing an example of a configuration of a selector control register in FIG. 6.

FIG. 7A shows as a typical example, selector control register 243 of the selector control registers in the selector control circuit in FIG. 6.

Figure 7B:
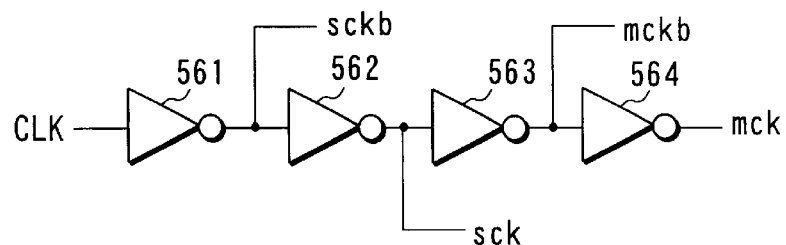
FIG. 7B shows an example of a circuit for generating a control signal for use in the circuit in FIG. 7A.

The selection signal selctl4 input to the selector control register 243 is input to a latch circuit 252 consisting of two inverters connected reversely in parallel, via a first CMOS transfer gate 251 controlled by complementary clock signals mck, mckb from the control signal formation circuit shown in FIG. 7B. A latched output from the latch circuit 252 is output as the selection signal selctl3 through a first inverter 253, a second MOS transfer gate 254 controlled by complementary clock signals sckb, sck, and a second inverter 255 in this order. The other selector control registers 241, 242 are similarly configured.

The complementary clock signals sckb, sck and mckb, mck are sequentially supplied by four-tiered inverters 561 to 564 to which the control clock signal CLK is input, as shown, for example, in FIG. 7B.

In the selector control register 243 configured as shown in FIG. 7A, when the first clock CLK sets the complementary clock signals sckb, sck to "L" and "H" correspondingly, respectively at input and output ends of the inverter 562, respectively, the second CMOS transfer gate 254 is first turned on, and an output from the latch circuit 252 is output as a selection signal output selctln–1 (selctl3) through the first inverter 253, the second MOS transfer gate 254, and the second inverter 255 in this order.

Subsequently, the selector control signals selctl1 to selctl3 are sequentially output from the selector control circuit 240.

The operation of the data selector circuit 220 will be explained with reference to FIG. 4. With the first transfer timing, the selector selection signal selctl3 is output, and the data DQdata4 on the above first data line 1154 and the output data seldata2 from the selector 1212 are input to the selector 1213. Based on the selection signal selctl3, the selector 1213 selects the data DQdata4, which is read out last from the corresponding cell array block 1104 and outputs this data as the seldata3, that is, the Doutdata, and then selects the other data, in this example, the output data seldata2 from the second selector 1212.

With the next transfer timing, control is provided as follows: The output data seldata1 from the first selector 1211 and the data DQdata3 on the data line 1153 are input to the second selector 1212, which thus selects one of these data which is read out earlier from the corresponding cell array block, in this example, the data DQdata3 on the third data line 1153. Then, based on the second selection signal selctl2, the second selector 1212 selects the other data, in this example, the output data seldata1 from the first selector 1211.

Then, the data DQdata1, DQdata2 on the first and second data lines 1151 and 1152, respectively, are input to the first selector 1211, which thus selects one of these data which is read out earlier from the corresponding cell array block, in this example, the data DQdata2 on the second data line 1152. Then, based on the first selection signal selctl1, the first selector 1211 selects the other data, in this example, the output data DQdata1.

The second and third selectors 1212 and 1213 can be expressed as an (i+1)-th one of (n−2) selectors controlled such that output data from an i-th (i=1 to n−2) selector and data on an (i+2) data line are input to this selector, which then selects one of these data which is read out earlier from the corresponding cell array block and then selects the other data based on a corresponding one of the second to (n−1)-th selection signals.

FIGS. 8A to 8L are timing charts showing an example of an operation of the data transfer circuit in FIG. 4. Referring to these timing charts, the operation of the data transfer circuit in FIG. 4 will be described below in conjunction with the operations of the data selectors in FIG. 5A, the selector control circuits in FIG. 6, and the selector control registers in FIG. 7A.

In the selector control circuit 240, the selection signals selctl4, selctl3, selctl2, selctl1 each have an initial value of a "L" level, as shown in FIGS. 8B to 8E.

First, at a rising edge of the control clock signal CLK at a point of time T1, the selection signal selctl4 input to the first tier is set to an "H" level and then passes through the selector control register 243 to become the selection signal selctl3. Then, at a rising edge of the control clock signal CLK at a point of time T2, the "H" level of the selection signal selctl3 passes through the selector control register 242 to become the selection signal selctl2. Then, at the next rising edge of the control clock signal CLK, the "H" level of the selection signal selctl2 passes through the selector control register 241 to become the selection signal selctl1.

In this manner, based on the clock signal CLK, the selection signal selct4 input to the first tier is sequentially transferred to generate the selection signals selctl3 to selctl1, which control the selectors 1213 to 1211 in the data selector circuit 220 in FIG. 4, respectively, in order to transfer data.

In this case, in the data selector circuit 220, the first selector 1211 selects the data DQdata2 when the selection signal selctl1 is at the "L" level and selects the data DQdata1 when the selection signal selctl2 is at the "H" level, before outputting the data as the seldata1.

The second selector 1212 selects the data DQdata3 when the selection signal selctl2 is at the "L" level and selects the output data from the preceding first selector 1211 (DQdata2 or DQdata1) when the selection signal selctl2 is at the "H" level, before outputting the data as the seldata2.

In addition, the third selector 1213 selects the data DQdata4 when the selection signal selctl3 is at the "L" level and selects the output data from the preceding second selector 1212 (DQdata3, DQdata2, or DQdata1) when the selection signal selctl3 is at the "H" level, before outputting the data as the seldata3.

Thus, in an initial state, the DQdata2 is output as the seldata1, the DQdata3 is outputs as the seldata2, and the third selector 1213 selects and outputs the DQdata4 as the Doutdata.

When the selection signal selctl3 is set to the "H" level as shown in FIG. 8C, the DQdata3, which is the seldata2, is output through the third selector 1213 as the Doutdata. The seldata1 and seldata2, however, are still at the "L" level and thus do not change.

Next, when the selection signal selctl1 is set to the "H" level as shown in FIG. 8E, the first selector 1211 selects the DQdata1 as the seldata1, which is then output through the second and third selectors 1212 and 1213 as the Doutdata.

The readout data DQdata1 to DQdata4 are read out with timings such as those shown in FIGS. 8F to 8I based on address signals from the address buffer 1113, and the data DQdata1, which is output last, has only to have its state established before the selection signal selctl1 is set to the "H" level, indicating a large margin for the DQdata1 readout operation compared to the data transfer block in the conventional example.

That is, in the data transfer circuit according to the above embodiment, the selection signals selctl1 to selctl3 are generated so that the DQdata1 to DQdata3 are selected by the selectors 1211 to 1213, respectively, later than the DQdata4. This operation yields a temporal margin for determining the DQdata1, thereby providing a larger operational margin than in the conventional example.

In addition, the data DQdata1 read out from the cell array block 1101 is not directly output as the Doutdata but through the selectors 1211 to 1212, and drive elements such as transistors are inserted in the middle of a signal path to the output buffer 1118. This configuration serves to restrain possible deformation of waveforms and a possible delay in signal transmission.

In this case, the four cell array blocks 1101 to 1104 are arranged from a chip peripheral portion to a chip central portion, and even with different signal line wiring lengths for readout control, a timing margin for data transfers from the cell array block 1101 in the chip peripheral portion is consequently improved. In designing data output timings, only the data output first from the cell array block 1104 in the chip central portion must be assumed, thereby improving the speed performance of the entire device.

The data transfer circuit according to the above embodiment uses as the selector control circuit 240 for controlling the data selector circuit 220, the shift register consisting of the three registers 243 to 241 for sequentially generating the third to first selection signals selctl3 to selctl1, respectively, in synchronism with the control clock signal CLK. The present invention is not limited to this aspect but another means, for example, n decoders may be used to sequentially generate the third to first selection signals selctl3 to selctl1.

Figure 9:
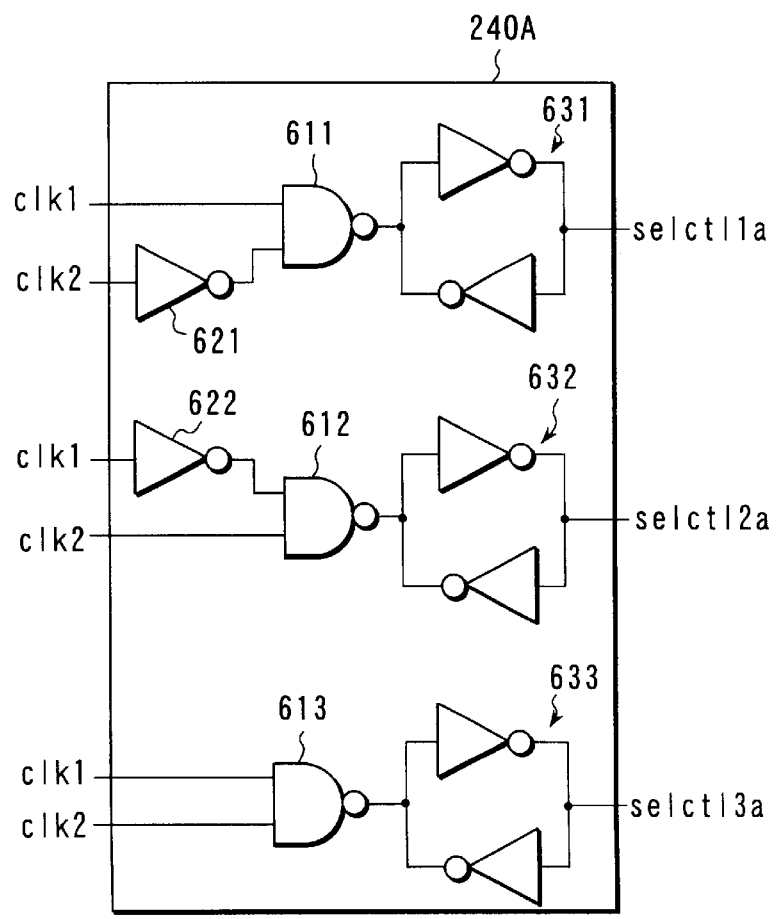
FIG. 9 is a logic circuit diagram showing another example of the selector control circuit in FIG. 4.

FIG. 9 shows another example of the selector control circuit in FIG. 4.

This selector control circuit 240A comprises a first to a third decoders 611 to 613, and a first clock signal clk1 obtained by dividing the frequency of the control clock signal CLK into two and a second clock signal clk2 obtained by dividing the frequency of the clock signal clk1 into two are used to generate three decode signals in accordance with cycles of the decode control clock signal CLK in such a manner that the signals are sequentially delayed, as shown in FIGS. 10A to 10C.

The first decoder 611 consists of a NAND gate to which the first clock signal clk1 and a signal /CLK2 generated by an inverter 621 reversing the second clock signal clk2 are input. The second decoder 612 consists of a NAND gate to which the second clock signal clk2 and a signal /CLK1 generated by an inverter 622 reversing the first clock signal clk1 are input. The third decoder 613 consists of a NAND gate to which the first and second clock signals clk1 and clk2 are input.

A first to a third latch circuits 631 to 633 latch decoded outputs from the first to third decoders 611 to 613, respectively, and are reset after a predetermined period of time. These latch circuits 631 to 633 correspondingly output the first to third selection signals selctl1a to selctl3a.

FIGS. 10A to 10M are timing charts showing an example of operations of the selector control circuit in FIG. 9 and of the data selector circuit 220 in FIG. 4, which is controlled by the selection signals selctl1a to selctl3a output from the selector control circuit.

First, at a point of time T1 in FIG. 10A, when the control clock signal CLK is set to the "H" level, the first and second clock signals clk1 and clk2 in FIGS. 10B and 10C, respectively are each set to the "H" level, the decoded output from the third decoder 613 is set the "L" level, and a latched output from the third latch circuit 633 (third selection signal selctl3a) is set to the "H" level.

At a point of time T2, when the next control clock signal CLK is set to the "H" level, the first clock signals clk1 are set to the "L" level, and the output signal /CLK1 from the inverter 622 is set to the "H" level. In addition, the decode output from the second decoder 612, to which the signal /CLK1 and the second clock signal clk2 at the "H" level are input, is set to the "H" level, and a latched output from the second latch circuit 632 (second selection signal selctl2a) is set the "H" level.

At a point of time T3, when the next control clock signal CLK is set to the "H" level, the first clock signals clk1 are set to the "H" level again, the second clock signals clk2 are set to the "L" level, and the output signal /CLK2 from the inverter 621 is set to the "H" level. In addition, the decode output from the first decoder 611, to which the signal /CLK2 and the first clock signal clk1 at the "H" level are input, is set to the "L" level, and a latched output from the first latch circuit 631 (first selection signal selctl1a) is set the "H" level.

In this manner, the selection signals select selctl3a to selctl1a are sequentially generated based on the control clock signal CLK, which controls the selectors 1213 to 1211 in the data selector circuit 220 in FIG. 4, respectively, so as to transfer data.

Figure 11:
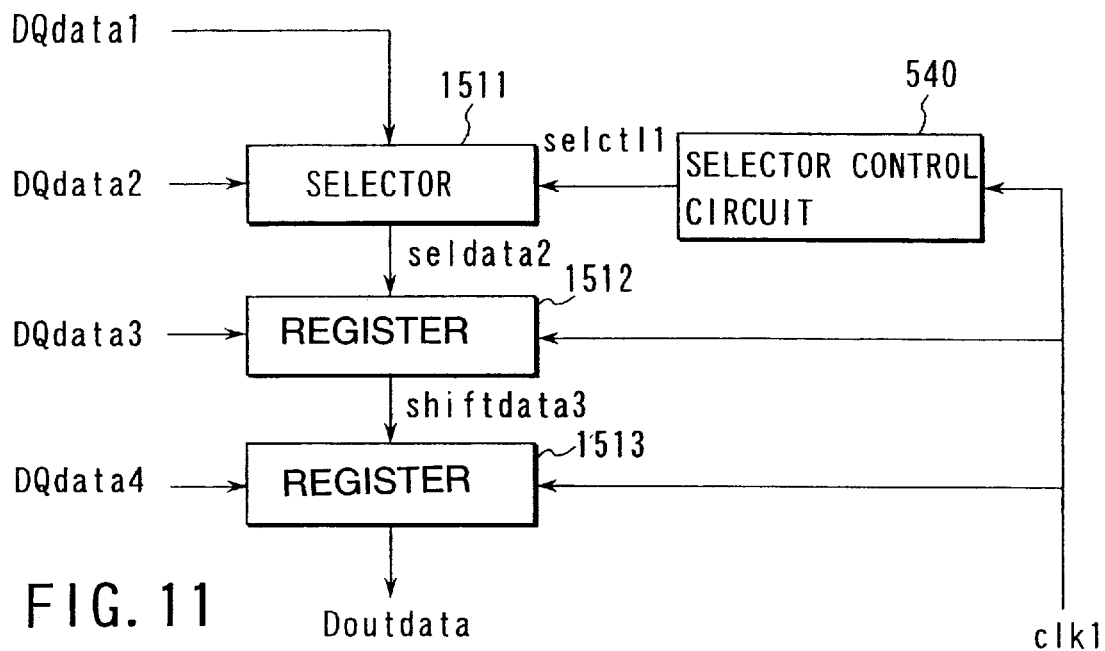
FIG. 11 is a block diagram showing another example of a data transfer block.

In the embodiment in FIG. 4, a data transfer block circuit is configured so that the three selectors 1211 to 1213 are used to read the readout data DQdata1 to DQdata3, DQdata2, DQdata1 out t the output buffer 1118 in accordance with the control signals selctl1, selctl2, selctl3 each supplied by the selector control circuit 240. FIG. 11 shows a simplified example of a circuit configuration according to the embodiment in FIG. 4.

In FIG. 11, the readout data DQdata4, DQdata3, DQdata2, DQdata1 are read out from the cell array block 1100 in this order. The two readout data DQdata2, DQdata1, which are read out later, are supplied to a selector 1511 configured similarly to the embodiment in FIG. 4. The selector 1511 has its data selection operation controlled by the selector control signal selctl1 from a selector control circuit 540 configured similarly to FIG. 4 so that the data DQdata2, DQdata1 are transferred to the next register 1512 in this order as the transfer data seldata2.

The data DQdata3 is also supplied to the register 1512, which unlike the selector 1511, has its transfer operation directly controlled by the control clock CLK1. An output from the register 1512 is transferred to the next register 1513 as the transfer data shiftdata3.

The data DQdata4 is also supplied to the register 1513, which like the register 1512, has its transfer operation directly controlled by the control clock CLK1. An output from the register 1513 is transferred to the output buffer 1118 in FIG. 4 as the output data Doutdata.

The operation of the circuit in FIG. 11 will be explained below with reference to FIGS. 12A to 12I. First, before a clock CLK1 is set to the H level at the point of time T1, the data other than the data DQdata1, that is, the data DQdata4, Dqdata3, DQdata2, are loaded in the selector 1511 as shown in FIGS. 12D to 12F. Then, when the clock CLK1 rises at the point of time T1, the readout data DQdata4 is output as the Doutdata. At this point, as the transfer data shiftdata3, the readout data DQdata3 is transferred from the register 1512 to the register 1513. At the same time, as the transfer data shiftdata2, the readout data DQdata2 is transferred from the selector 1511 to the register 1512. At this point, the data DQdata1, which is read out last, has not been established yet as shown in FIG. 12C.

At the point of time T2 corresponding to the next rising edge of the clock CLK1, the readout data DQdata3 is output as the output data Doutdata. Then, as the transfer data seldata2, the readout data DQdata2 is transferred from the selector 1511 to the register 1512. At this point, the data DQdata1, which is read out last, has been established as shown in FIG. 12C and the selection control signal selctrl1 is set to the "H" level, whereby as the data seldata2 transferred from the selector 1511, the readout data DQdata1 is transferred to the register 1512. Subsequently, clock synchronization with the rising edge of the clock CLK1, the readout data are sequentially transferred and output as the output data Doutdata.

In this manner, the data DQdata1, which is read out last, has only to be established before the rising edge of the second clock CLK1, thereby providing a large timing margin.

The semiconductor integrated circuit according to the above embodiment provides a large timing margin for loading of data output from some of the plurality of circuit blocks the data output of which is controlled by the corresponding control signal lines, the some circuit blocks being subjected to a large signal delay due to the corresponding control signal lines. Consequently, the transfer of data output from the some circuit blocks is prevented from determining all the data output from each circuit block, thereby enabling all the data output from each circuit block to be reliably output.

Thus, if the present invention is applied to a clock synchronization DRAM in which the cell array blocks are arranged from the chip peripheral portion to the chip central portion, then the timing margin for data transfers output from the cell array block in the chip peripheral portion is improved, so that only the data output from the cell array block in the chip central portion must be assumed in designing data output timings, thereby improving the speed performance of the entire device.

An embodiment of another semiconductor integrated circuit according to the present invention will be described below in detail with reference to FIGS. 13 to 24A, 24B. Although the present invention is applicable to various semiconductor integrated circuits (DRAMs, SRAMs, EPROMs, MRAMS, etc.), it is particularly effective on clock synchronization DRAMs that operate clock synchronization with an external clock and in which a large number of circuits may operate simultaneously. Thus, the following description refers to a clock synchronization DRAM by way of example.

Figure 13:
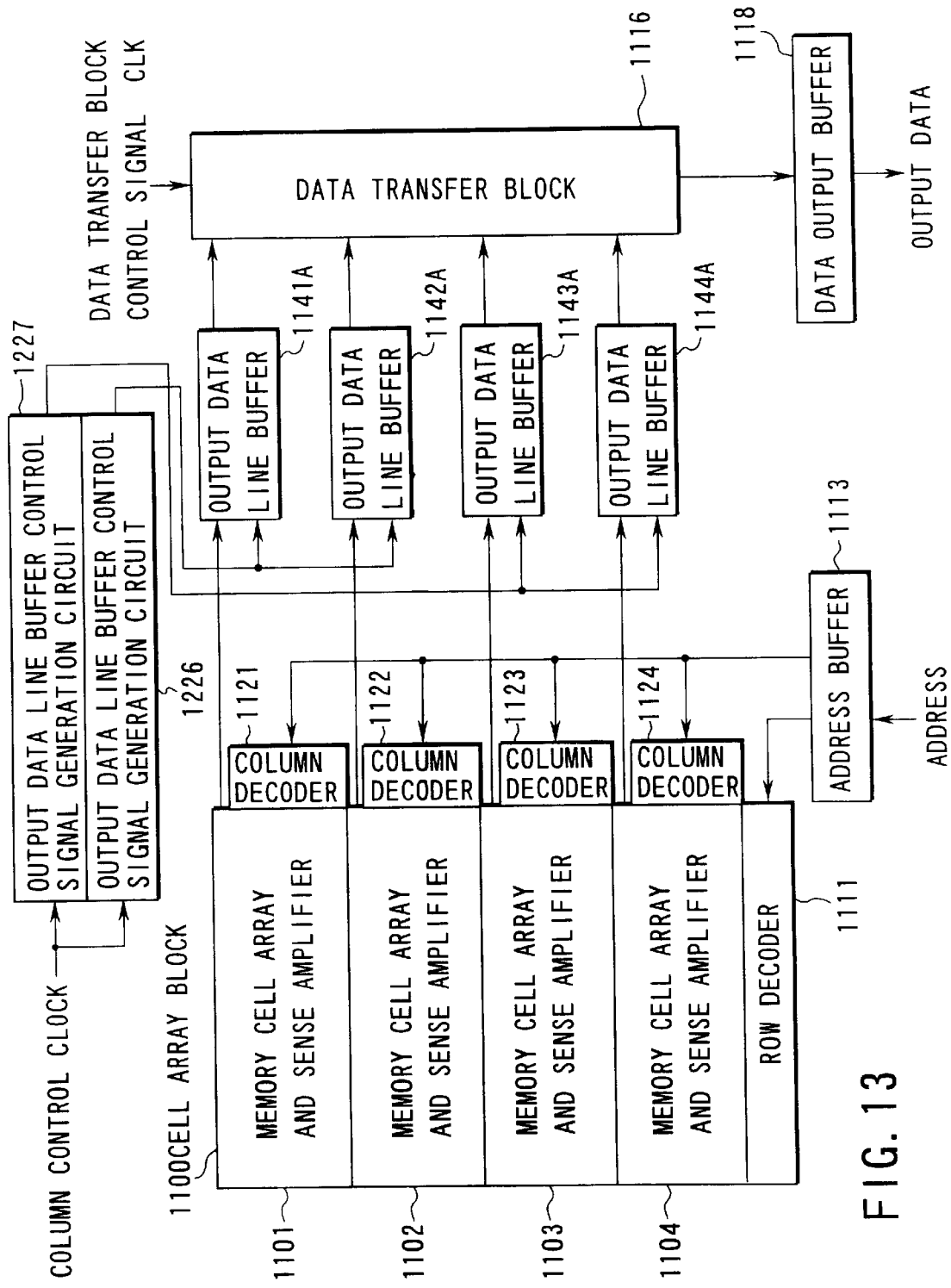
FIG. 13 is a block diagram showing a configuration of essential parts of another embodiment of the present invention.

FIG. 13 shows a configuration of part of a clock synchronization DRAM according to the embodiment of the present invention, particularly, of its memory cell arrays and other parts related to data transfer outputs. In the following description, the same parts as in the embodiment in FIGS. 4 to 12 have the same references for simplicity.

This clock synchronization DRAM comprises a cell array block 1100, output data line buffers 1141A–1144A, a data transfer block 1116, a data output buffer 1118, and other components, and has its operation controlled by the clock synchronization signal CLK so as to continuously output data.

In addition, the memory cell arrays are divided into n (in this case, n=4) cell array blocks 1101 to 1104 and include a row decoder 1111 shared by each of the cell array blocks 1101 to 1104 and column decoders 1121 to 1124 corresponding to the cell array blocks 1101 to 1104, respectively. The cell array blocks 1101 to 1104 each have the memory cell array and a sense amplifier circuit. Output data line buffers 1141A to 1144A are connected to the cell array blocks 1101 to 1104.

A control signal from an output data line buffer control signal generation circuit 1226 is simultaneously supplied to the output data line buffers 1141A, 1142A, while a control signal from an output data line buffer control signal generation circuit 1227 is simultaneously supplied to the output data line buffers 1143A, 1144A. A column control clock signal is simultaneously supplied to these output data line buffer control signal generation circuit 1226, 1227.

The operation of the memory control circuit in FIG. 13 will be explained below.

<Data Output>

First, a data output (readout) will be described.

To read out data stored in the memory cell array 1100, an address required to read out the data enters an address buffer 1113. A row address is decoded in the row decoder 1111, while a column address is decoded in the column decoders 1121 to 1124, whereby an address with which the data is read out from the cell array block 1100 is selected.

The data corresponding to the selected address is amplified by a sense amplifier and transferred to the output data line buffers 1141A to 1144A in accordance with timing signals generated by the output data line buffer control signal generation circuits 1226, 1227.

This embodiment is characterized in that the output data line buffer control signal generation circuits 1226 and 1227 generate different timing signals with different timings. For example, the output data line buffer control signal generation circuit 1226 is assumed to generate timing signals later than the output data line buffer control signal generation circuit 1227. In this case, the output data line buffers 1141A and 1142A, which are controlled by the output data line buffer control signal generation circuit 1226, are activated later than the output data line buffers 1143A and 1144A, which are controlled by the output data line buffer control signal generation circuit 1227. Consequently, the number of output data line buffers that simultaneously start to be activated in this example is half the total number of output data line buffers. That is, a peak current flowing through the output line buffers can be reduced.

Next, the data read out and stored in the output data line buffers 1141A to 1144A is output to the data output buffer 1118 via the data transfer block 1116.

Each building block will be described below in detail.

<<Output Data Line Buffer>>

Figure 14:
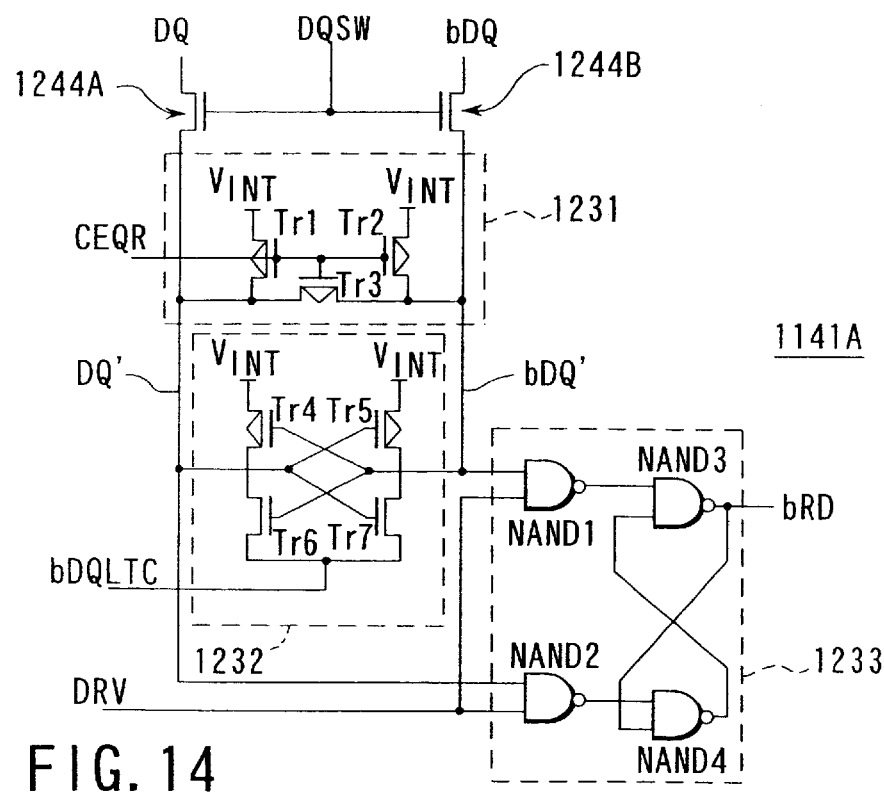
FIG. 14 is a block diagram showing an example of a configuration of an output data line buffer in FIG. 12.

FIG. 14 shows a circuit diagram of one of the output data line buffers shown in FIG. 13, for example, the buffer 1141A. The output data line buffer 1141A has switching NMOS transistors 1244A, 1244B connected to a pair of data lines, DQ, bDQ, respectively, to which data amplified by the corresponding sense amplifier circuit included in the cell array block 1100 is transmitted, an equalized circuit 1231 for making the potentials of a pair of internal data lines DQ', bDQ', a differential amplifier circuit 1232 for amplifying a difference in potential between the pair of data lines DQ, bDQ, and a data transfer circuit 1233 for sending output data from the differential amplifier circuit 1232 out to the data transfer block 1116.

A common signal DQSW is input to both gate electrodes of the switching NMOS transistors 1244A, 1244B, and current paths of the transistors 1244A, 1244B are connected in series to the data lines DQ, bDQ, respectively.

The equalize circuit 1231 is comprised of three PMOS transistors Tr1, Tr2, Tr3 having gate electrodes that are connected together and to which an equalize signal CEQR is input. Of the three PMOS transistors Tr1 to Tr3, the PMOS transistor Tr3 has a source and a drain connected to the data lines DQ' and bDQ', respectively. The remaining two PMOS transistors Tr1, Tr2 have sources both connected to an internal voltage source VINT and drains connected to the source and drain of the PMOS transistor Tr3, respectively.

The differential amplifier circuit 1232 has two sets of a NMOS transistor and a PMOS transistor Tr4, Tr6, Tr5, Tr7 having gates connected together, wherein a drain of the NMOS transistor Tr6 in one set is connected to a drain of the PMOS transistor in the other set. A signal bDQLTC is input to sources of the NMOS transistors Tr6, Tr7, and the internal voltage source VINT is connected to sources of the PMOS transistors Tr4, Tr5.

A data transfer circuit 1233 has two NAND circuits NAND1, NAND2 in a frontward tier thereof and two NAND circuits NAND3, NAND4 in a rearward tier thereof. A signal DRV is input to an input terminal of one NAND2 of the NAND circuits in the front tier, whereas a complementary output signal from the differential amplifier circuit 1232 is input to an input terminal of the other NAND circuit NAND1. The NAND circuits NAND3, NAND4 each receive at an input terminal thereof, an output from the corresponding NAND circuit in the front tier and an output from the other NAND circuit in the rear tier.

Next, the operation will be described below. First, the data read out from the memory cell and amplified by the sense amplifier circuit is transmitted to the data lines DQ, bDQ. Then, the signal CEQR is switched from the "L" to "H" level to complete equalizing the potentials of the data lines DQ', bDQ'.

Next, the signal DQSW is switched from the "L" to "H" level to load the potentials of the data lines DQ, bDQ in the data lines DQ', bDQ'. Next, the signal bDQLTC is switched from the "H" to "L" level to amplify the data loaded in the data lines DQ', bDQ'. Next, the signal DRV is set to the "H" level to output the amplified data to the data line bRD.

The other output data line buffers 1142A to 1144A are similarly configured.

<<Output Data Line Buffer Control Signal Generation Circuit>>

FIGS. 15A and 15B show circuit diagrams of the output data line buffer control signal generation circuit 1227, which is shown in FIG. 13. The output data line buffer control signal generation circuit 1227 has a NAND circuit NAND5 in a most frontward tier to which a column control clock circuit COLCLK and a column enable signal COLENB are input. Then, the input signals pass, for example, through seven inverter circuits INV1 to INV7 to generate the signal CEQR. For example, the second inverter circuit INV2 is comprised of a PMOS transistor Trl1, a NMOS transistor Trl2, and a resistor R1, and the transistors TRl1, Trl2 have gates each connected to an output terminal of the first inverter circuit INV1. If, for example, an output from the inverter circuit INV1 is at the "L" level, then the transistor Trl1 is turned on and the "H" level from the power supply voltage VINT is transmitted to the third inverter INV3.

Alternately, an output from the NAND circuit NAND5 passes, for example, through 10 inverter circuits INV1 to INV3, INV8 to INV14 to generate the signal bDQLTC. Alternately, the output from the NAND circuit NAND5 passes, for example, through 13 inverter circuits INV1 to INV3, INV8 to INV13, INV15 to INV18 to generate a signal DRV.

Further, a signal generated by allowing the output from the NAND circuit NAND5 to pass, for example, through the 9 inverter circuits INV1 to INV3, INV8 to INV13 and a signal generated by allowing the output from the NAND circuit NAND5 to pass, for example, through the 6 inverter circuits INV1 to INV6 are input to a NOR circuit NOR1 to generate the signal DQSW. Next, the operation of the output data line buffer control signal generation circuit 1227 will be described. In the circuit configured as shown in FIG. 15A, intermediate signals DQSWOPN and DQRON are generated from the column control clock signal COL-CLK and the column enable signal COLENB. From these intermediate signals DQSWOPN and DQRON, the circuit in FIG. 15B generates the signals CEQR, DQSW, bDQLTC, DRV.

The output from this output data line buffer control signal generation circuit 1227 is as follows. When the column control clock signal COLCLK and the column enable signal COLENB are set to the "H" level, the signal CEQR is first switched from the "L" to "H" level. At the same time, the signal bDQLTC is switched from the "H" to "L" level. Finally, the signal DRV is switched from the "L" to "H" level. These signals control the output data line buffers 1143A, 1144A.

FIGS. 16A, 16B show circuit diagrams of the output data line buffer control signal generation circuit 1226, which is shown in FIG. 13. The output data line buffer control signal generation circuit 1226 differs from the output data line buffer control signal generation circuit 1227 in that it includes a delay circuit 1234 comprised of the NAND circuit NAND5 in the most forward tier followed by two inverter circuits INV20, INV21, a resistor R3, and a capacitor C3. Thus, the same parts as in FIGS. 15A, 15B have the same references, and description thereof is omitted. The inverter INV20 is comprised of two transistors Tr15, Tr16.

Thus, the output data line buffer control signal generation circuit 1226 generates the timing signals CEQR, DQSW, bDQLTC, DRV later than the output data line buffer control signal generation circuit 1227 by a signal delay corresponding to the two inverters INV20, INV21.

The operation of the output data line buffer control signal generation circuit 1226 is almost the same as the operation of the output data line buffer control signal generation circuit 1227 and differs therefrom in that the former generates each signal later than the latter. These signals each control the output data line buffers 1141A, 1142A.

<<Data Transfer Block>>

Figure 17:
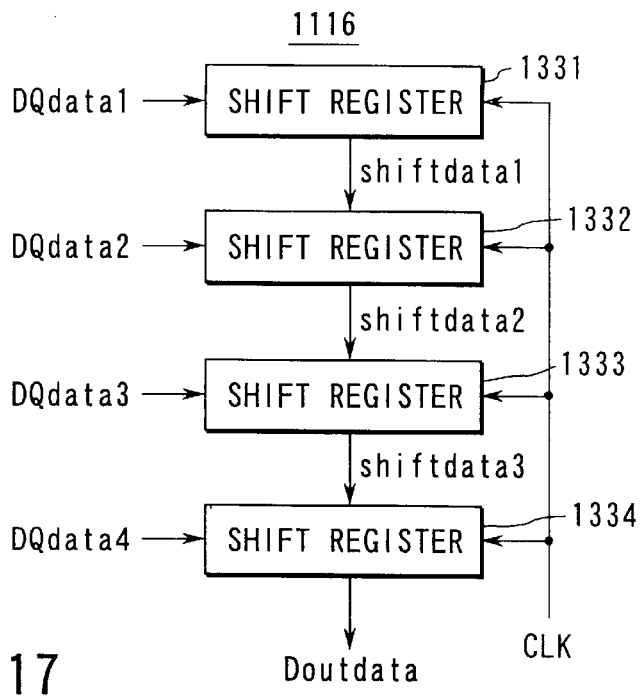
FIG. 17 is a block diagram showing an example of a configuration of a data transfer block in FIG. 13.

FIG. 17 shows a block diagram of the data transfer block 1116, which is shown in FIG. 13. The data transfer block 1116 is comprised of a data selector circuit such as shift registers 1331 to 1334. The following description uses the shift registers 1131 to 1134 as the data selector circuit. The data DQdata1 to DQdata 4 output from the output data line buffers 1141A to 1141D, respectively, are stored in the shift registers 1331 to 1334. The data stored in the shift registers 1331 to 1334 are output to the data output buffer 1118 based on the control clock CLK.

Figure 18A:
FIGS. 18A to 18I are timing charts showing an operation of the data transfer block in FIG. 17.
Figure 18B:
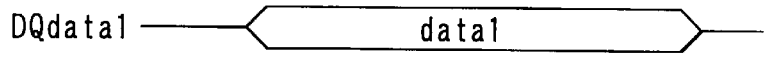
Figure 18C:
Figure 18D:
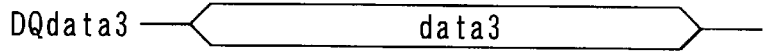
Figure 18E:
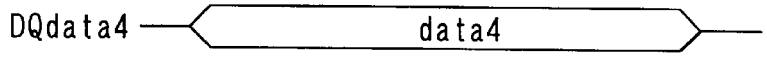
Figure 18F:
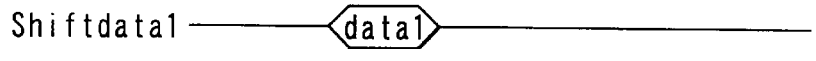
Figure 18G:
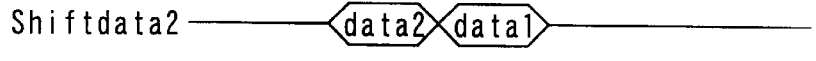
Figure 18H:
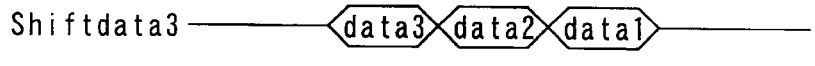

FIGS. 18A to 18I show timing charts of the data transfer buffer 1116, which is shown in FIG. 17. First, the data DQdata1 to DQdata4 output from the output data line buffers 1141A to 1144A are stored in the shift registers 1331 to 1334, respectively. At this point, the data DQdata1 and DQdata2 are input later than the data DQdata3 and DQdata4, as shown in FIGS. 18B to 18E. The data are then output from the shift register 1334 to the data output buffer 1118 based on the control clock CLK in FIG. 18A. In this case, as shown in FIGS. 18F to 18H, the data DQdata1, which is stored in shift register 1331, is shifted to the shift register 1332, the data DQdata2, which is stored in shift register 1332, is shifted to the shift register 1333, and the data DQdata3, which is stored in shift register 1333, is shifted to the shift register 1334.

Figure 18I:
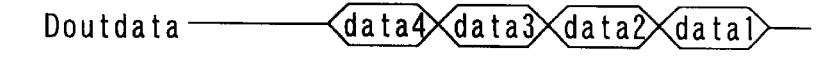

Likewise, the data DQdata3, DQdata2, DQdata1 are each output to the data output buffer 1118 based on the control clock CLK, as shown in FIG. 18I.

<<Variation of the Data Transfer Block>>

Next, a variation 1116A of the data transfer block 1116, which is shown in FIG. 13, is shown in FIG. 19. The data DQdata1 to DQdata4 output from the output data line buffers 1141A to 1144A are stored in shift registers 1331 to 1334, respectively. The data stored in the shift registers 1341 to 1344 are then output to the data output buffer 1118 based on the control clock CLK. This operation is the same as in the data transfer block shown in FIG. 17.

The data transfer block shown in FIG. 19 differs from the data transfer block shown in FIG. 17 in that the shift registers 1341 and 1342 are controlled by the control clock CLK2, while the shift registers 1343 and 1344 are controlled by the control clock CLK1 and in that data is transferred to the data output buffer 1118 not only from the shift register 1344 but also from the shift register 1342. The control clock CLK2 is a clock signal issued later than the control clock CLK1. The control clocks CLK1 and CLK2 are generated by alternately providing two internal clock signals as shown in FIGS. 20A and 20B.

FIGS. 20A to 20I show timing charts of the data transfer block shown in FIG. 19. The data DQdata3 and DQdata4 output from the output data line buffers 1143A and 1144A are stored in the shift registers 1343 and 1344, respectively. Then, based on the control clock CLK1, the data DQdata4 is output from the shift register 1344 to the data output buffer 1118. At this point, the data DQdata3, which is stored in the shift register 1343, is shifted to the shift register 1344. Then, based on the next clock of the control clock CLK1, the data DQdata3 is output from the shift register 1344 to the data output buffer 1118. Before this point of time, the data DQdata1 and DQdata2 have only to be input to the shift registers 1341 and 1342, respectively.

Next, based on the control clock CLK2, the data DQdata2 is output from the shift register 1342 to the data output buffer 1118. At this point, the data DQdata1, which is stored in the shift register 1341, is shifted to the shift register 1342. Then, based on the next clock of the control clock CLK2, the data DQdata1 is output from the shift register 1342 to the data output buffer 1118.

In the data transfer block shown in FIG. 17, data output to the data output buffer 118 must be started after all of the DQdata1 to DQdata4 have been established. That is, the data output must be started after the DQdata1 and DQdata2 have been input to the shift registers 1331, 1332, respectively, later than the remaining two data.

On the contrary, the variation 1116A of the data transfer block 1116, which is shown in FIG. 19, does not require the data output to be started after the DQdata1 and DQdata2 have been input to the shift registers 1341, 1342, respectively, later than the remaining two data, thereby preventing a possible timing delay in data output. Such a data transfer block can prevent a possible decrease in data transfer rate arising from delayed activation of the data line output buffers 1141A and 1142A.

<Data Input>

Figure 21:
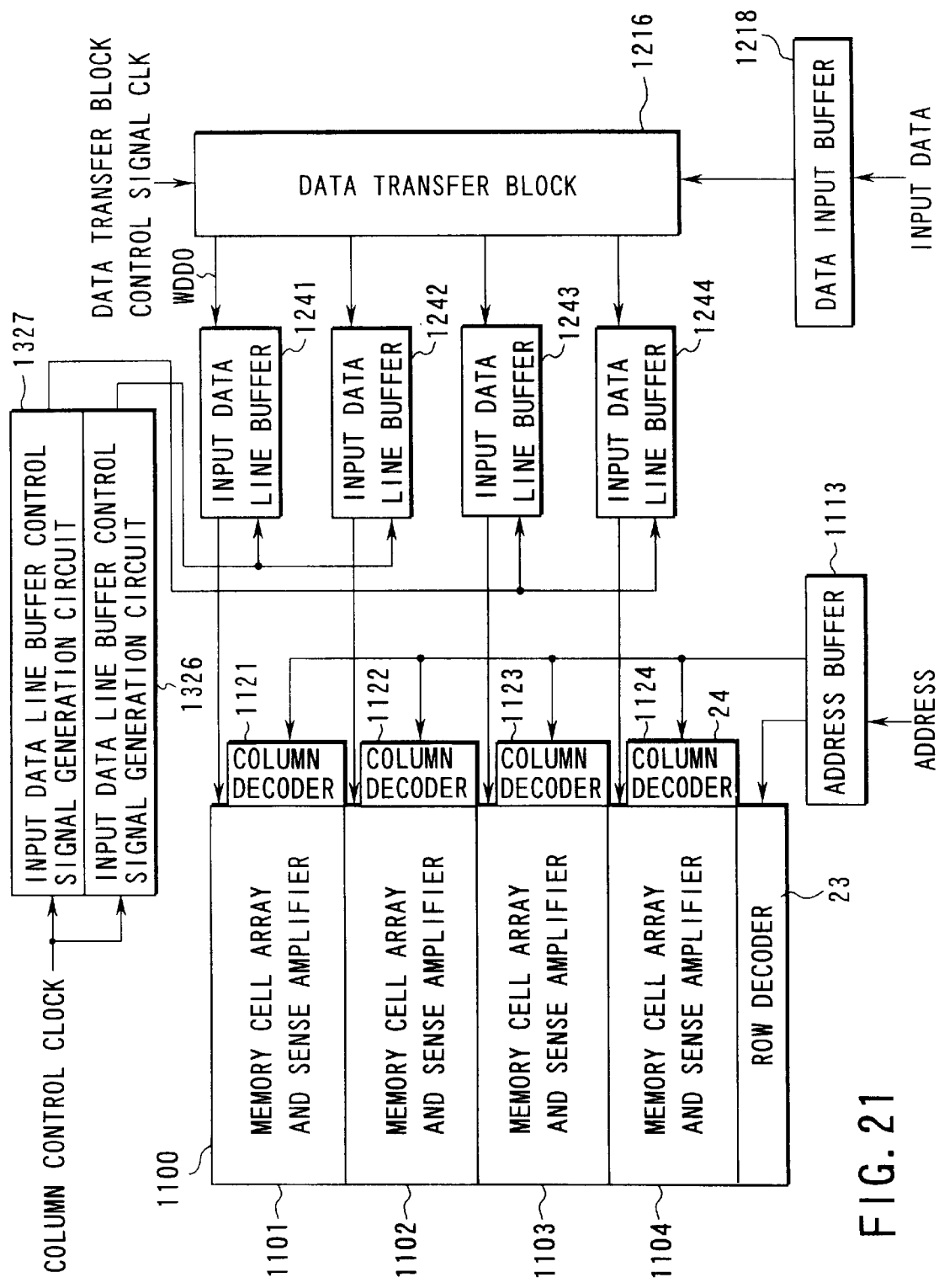
FIG. 21 is a block diagram showing a configuration of essential parts of yet another embodiment of the present invention.

Next, a data input (write) will be described with reference to FIG. 21. In FIG. 21, the same parts as in FIG. 13 have the same references, and detailed description thereof is omitted.

To write data to a memory cell in the cell array block 1100, an address required to write the data enters the address buffer 1113. A row address is decoded in the row decoder 1111, while a column address is decoded in the column decoders 1121 to 1124, whereby an address with which the data is written to the cell array block 1100 is selected.

The input data is input to input data line buffers 1241 to 1244 through a data input buffer 1218 and a data transfer block 1216.

The input data line buffers 1241 and 1242 are controlled by the input data line buffer control signal generation circuit 1326, while the input data line buffers 1243 and 1244 are controlled by the input data line buffer control signal generation circuit 1327. The input data line buffer control signal generation circuits 1326 and 1327 are characterized to generate different timing signals with different timings. For example, the input data line buffer control signal generation circuit 1326 is assumed to generate timing signals later than the output data line buffer control signal generation circuit 1327. In this case, the input data line buffers 1241 and 1242 are activated later than the input data line buffers 1243 and 1244, which are controlled by the input data line buffer control signal generation circuit 1327. Consequently, the number of input data line buffers that simultaneously start to be activated in this example is half (in this case, two) the total number of input data line buffers 1241 to 1244. That is, a reduced data timing margin originating in a difference in access time can be corrected, and a peak current flowing through the input data line buffers 1241 to 1244 can be reduced.

Then, each data is amplified by the sense amplifier circuit and then written to the corresponding memory cell at the selected address.

Each building block will be explained below in detail.

<<Input Data Line Buffer>>

Figure 22:
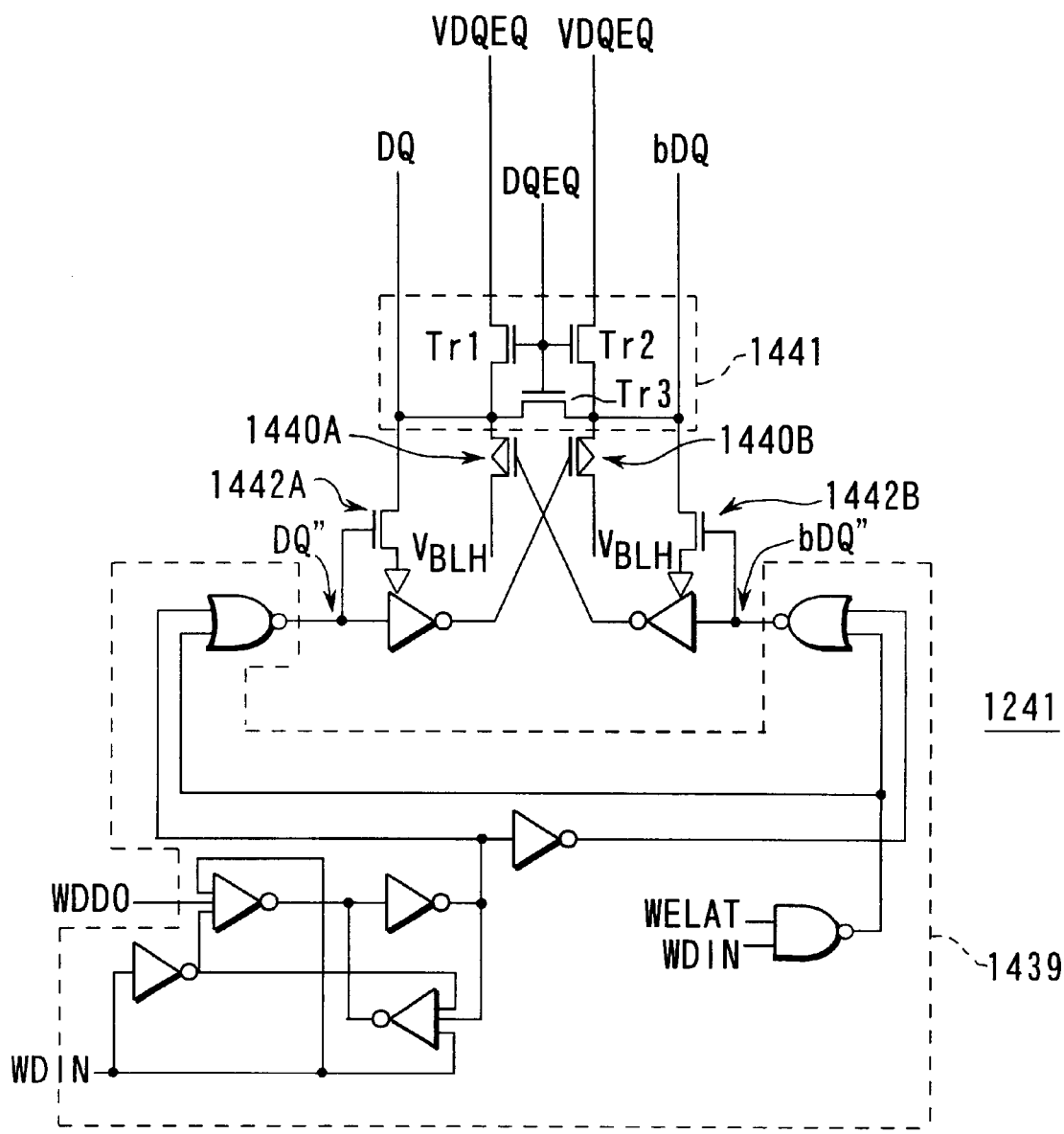
FIG. 22 is a block diagram showing an example of a configuration of an output data line buffer in FIG. 21.

FIG. 22 shows a circuit diagram of the input data line buffer 1241, which is shown in FIG. 21. The input data line buffer 1241 has a data transfer circuit 1439 and an equalize circuit 1441 both connected to a data line WDDO through which input data is transmitted.

Based on signals WDIN and WELAT, the data transfer circuit 1439 transfers the data transmitted through the data line WDDO, to data lines DQ" and bDQ" as complementary data.

The equalize circuit 1441 consists of NMOS transistors Tr1 to Tr3 each having a gate electrode to which a signal DQEQ is input and having a current path between the data lines DQ and bDQ.

NMOS transistors 1442A, 1442B each have a gate electrode to which data on the data lines DQ" and bDQ" are input and also have a current path connected in series between the data lines DQ, bDQ and a ground potential. In addition, outputs from two inverter circuits connected to the data lines DQ", bDQ", respectively, are connected to PMOS transistors 1440A, 1440B, respectively. The PMOS transistors 1440A, 1440B have drains each connected to a high potential VBLH and sources connected to the data lines DQ and bDQ, respectively.

Next, the operation will be described.

Input data is transmitted from the data transfer block 1216 to the data line WDDO. Then, the signal DQEQ is switched from the "H" to "L" level to complete equalizing the data lines DQ, bDQ. Next, the signals WDIN and WELAT are each switched from the "L" to "H" level to transmit complementary signals for the input data to the data lines DQ", bDQ". If the data transmitted to the data line DQ" is "1" and the data transmitted to the data line bDQ" is "0", the NMOS transistor 1442A is turned on and the data line DQ is set to the "L" level. On the other hand, the PMOS transistor 1440B is also turned on, and the data line bDQ is set to VBLH, that is, the "L" level.

<<Input Data Line Buffer Control Signal Generation Circuit>>

FIGS. 23A, 23B show circuit diagrams of the input data line buffer control signal generation circuit 1327, which is shown in FIG. 21. A signal WRICYC1 based on a column control clock passes, for example, through three inverter circuits INV30 to INV32 to generate the signal DQEQ. In addition, the signal WRICYC1 passes, for example, through four inverter circuits INV30, INV31, INV33, INV34 to generate the signal WDIN. Further, a signal WRICYC2 based on a column control clock passes, for example, through four inverter circuits INV35 to INV38 to generate the signal WELAT.

Next, the operation of the input data line buffer control signal generation circuit 1327 will be described. When the signals WRICYC1 and WRICYC2 are both set to the "H" level, the signal DQEQ is first switched from the "H" to "L" level. Then, the signals WDIN and WELAT are simultaneously switched from the "L" to "H" level. These signals control the input data line buffers 1243, 1244, which are shown in FIG. 21.

FIGS. 24A and 24B show circuit diagrams of the input data line buffer control signal generation circuit 1326, which is shown in FIG. 21. The input data line buffer control signal generation circuit 1326 differs from the input data line buffer control signal generation circuit 1327 in that the inverter circuits INV30, INV35 in the most forward tier constitute delay circuits 1450A, 1450B, respectively, including transistors Tr20, Tr21;Tr22, Tr23, resistors R5, R6, and capacitors C5, C6. Accordingly, the input data line buffer control signal generation circuit 1326 generates timing signals later than the input data line buffer control signal generation circuit 1327.

The operation of the input data line buffer control signal generation circuit 1326 is almost the same as the operation of the output data line buffer control signal generation circuit 1327 and differs therefrom in that the former generates each signal later than the latter. These signals each control the input data line buffers 1241, 1242.

As described above, the present invention according to this embodiment can increase the timing margin, which may be reduced by an access delay, and can reduce the peak current during I/O data transfers, as in the above embodiment. As a result, power noise can be decreased to enable the reduction of the power wiring width and the scale of an internal power voltage generation circuit. Therefore, the area of a chip in the semiconductor integrated circuit can be diminished.

The present invention is particularly effective on clock synchronization semiconductor memories that operate clock synchronization with an external clock and in which a large number of circuits may operate with the same timings.

In addition, the present invention can decrease the peak current during I/O data transfers to enable the reduction of the area of the chip in the semiconductor integrated circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
    a plurality of data lines through which data read from a plurality of cell array blocks are transmitted;
    a data selector having a plurality of cascade-connected selectors to which the data on the data lines are input, for selecting and outputting the data;
    an output buffer to which an output from said data selector is transmitted via an output signal line; and
    a selector control circuit for controlling and switching a selection operation of said data selector, wherein:
        said selector control circuit activates one of said cascade-connected selectors positioned closest to said output signal line or simultaneously activates at least two of said plurality of cascade-connected selectors.

2. A semiconductor integrated circuit according to claim 1, wherein said selector control circuit comprises:
    a plurality of cascade-connected selector control registers sequentially supplying a selector control signal to said data selector in response to a common clock.

3. A semiconductor integrated circuit comprising:
    first to n-th data lines through which data read from a plurality of cell array blocks are transmitted;
    a data selector circuit having at least one selector to which n data on the first to n-th data lines are input and a plurality of registers which are cascade-connected with said at least one selector and to which the corresponding data on the remaining data lines are input, the data selector circuit selecting and outputting the n data read out to said first to n-th data lines from said n cell array blocks;
    an output buffer to which an output from said data selector circuit is transmitted via an output signal line; and
    a selector control circuit for controlling and switching the selection operation of said data selector circuit, wherein:
        said selector control circuit is configured to simultaneously activate said cascade-connected at least one selector and the plurality of registers or activate one of the plurality of registers positioned closest to the output signal line.

4. A semiconductor control circuit comprising:
    first and second cell array blocks;
    a first data line for transmitting data read out from said first cell array block;
    a second data line for transmitting data read out from said second cell array block with a readout timing that is later than that for said first data line;
    a first data selector connected to said first data line;
    a second data selector connected to said second data line, said second data selector being cascade-connected to said first data selector;
    a first data selector control circuit for activating said first data selector;
    a second data selector control circuit for activating said second data selector later than said first data selector control circuit; and
    an output signal line connected to said first data selector to receive data transmitted from said first and second data selectors.

5. A semiconductor integrated circuit comprising:
    first to n-th data lines through which data read from n (n is a positive integral number) cell array blocks are transmitted;
    a data selector having a plurality of cascade-connected selectors for selecting an outputting said n data read out to said first to n-th data lines from said n cell array blocks, in the order in which the data are read out from the corresponding cell array blocks;
    an output buffer to which an output from said data selector is transmitted via an output signal line; and
    a selector control circuit for controlling and switching the selection operation of said data selector based on a control clock.

6. A semiconductor integrated circuit according to claim 5, wherein said data selector selects one of the n data read out of said first to n-th data lines from said n cell array blocks that is read out first from the corresponding cell array block and then sequentially selects and outputs the remaining data in synchronism with first to n-th selection signals in an order in which the data are read out from the corresponding cell array blocks.

7. A semiconductor integrated circuit according to claim 6, wherein:
    said first selection signal and second to (n−1)-th selection signals have their logic level reversed in synchronism with control clock signals in an order from the (n+1) selection signal to the first selection signal, and wherein:
        said data selector selects and outputs the data in an order from the data on said n-th data line to the data on said first data line.

8. A semiconductor integrated circuit according to claim 5, wherein said data selector comprises:
    a first selector controlled to select one of the data input through first and second of the data lines read out earlier from the corresponding cell array block and then to select the other data based on a first selection signal; and
    (n−2) (i+1) selectors controlled to select one of the output data from the i-th (i=1 to n−2) selector and data input through a (i+2) data line read out earlier from the corresponding cell array block and then to correspondingly select the other data based on second to (n−1)-th selection signals.

9. A semiconductor integrated circuit according to claim 8, wherein said selector control circuit comprises a shift register having n registers for generating said (n−1) to first selection signals in synchronism with said control clock.

10. A semiconductor integrated circuit according to claim 5, wherein:
    a first selection signal and second to (n−1)-th selection signals have their logic level reversed in synchronism with control clock signals in an order from the (n+1) selection signal to the first selection signal, and wherein:
        said data selector selects and outputs the data in an order from the data on said n-th data line to the data on said first data line.

* * * * *